United States Patent
Singh et al.

(10) Patent No.: US 7,290,239 B1
(45) Date of Patent: Oct. 30, 2007

(54) METHOD AND APPARATUS FOR PERFORMING POST-PLACEMENT FUNCTIONAL DECOMPOSITION FOR FIELD PROGRAMMABLE GATE ARRAYS

(75) Inventors: Deshanand Singh, Toronto (CA); Valavan Manohararajah, Scarborough (CA); Karl Schabas, Toronto (CA)

(73) Assignee: Altera Corporation, San Jose, CA (US)

( * ) Notice: Subject to any disclaimer, the term of this patent is extended or adjusted under 35 U.S.C. 154(b) by 342 days.

(21) Appl. No.: 10/858,300

(22) Filed: Jun. 1, 2004

Related U.S. Application Data

(63) Continuation-in-part of application No. 10/679,593, filed on Oct. 6, 2003.

(51) Int. Cl.
  *G06F 17/50* (2006.01)
(52) U.S. Cl. .......................... 716/18; 716/16
(58) Field of Classification Search .......... 716/112–18, 716/16–18
  See application file for complete search history.

(56) References Cited

U.S. PATENT DOCUMENTS

| | | | | |
|---|---|---|---|---|
| 6,405,345 | B1 * | 6/2002 | Ginetti ......................... | 716/2 |
| 6,871,336 | B1 * | 3/2005 | Anderson ...................... | 716/9 |
| 6,973,632 | B1 * | 12/2005 | Brahme et al. ................ | 716/6 |
| 7,076,758 | B1 * | 7/2006 | Srinivasan et al. ........... | 716/11 |
| 7,080,344 | B2 * | 7/2006 | Bajuk et al. .................. | 716/16 |

* cited by examiner

*Primary Examiner*—Paul Dinh
*Assistant Examiner*—Binh Tat
(74) *Attorney, Agent, or Firm*—L. Cho

(57) ABSTRACT

A method for designing a system on a target device utilizing field programmable gate arrays (FPGAs) includes synthesizing a design for the system. Components in the design are mapped onto resources on the target device. Placement locations are determined for the components on the target device. The design for the system is restructured after placement locations for the components are determined to improve timing for the system.

14 Claims, 23 Drawing Sheets

| $i_{14}i_{11}i_{16}$ \ $i_{15}i_{12}i_{13}$ | 000 | 001 | 010 | 011 | 100 | 101 | 110 | 111 |
|---|---|---|---|---|---|---|---|---|
| 000 | 1 | 1 | 1 | 1 | 1 | 1 | 1 | 1 |
| 001 | 0 | 1 | 1 | 0 | 1 | 1 | 1 | 1 |
| 010 | 0 | 1 | 1 | 0 | 1 | 1 | 1 | 1 |
| 011 | 1 | 1 | 1 | 1 | 1 | 1 | 1 | 1 |
| 100 | 0 | 0 | 0 | 0 | 0 | 0 | 0 | 0 |
| 101 | 1 | 0 | 0 | 1 | 0 | 0 | 0 | 0 |
| 110 | 1 | 0 | 0 | 1 | 0 | 0 | 0 | 0 |
| 111 | 0 | 0 | 0 | 0 | 0 | 0 | 0 | 0 |

FIG. 14

METHOD AND APPARATUS FOR PERFORMING POST-PLACEMENT FUNCTIONAL DECOMPOSITION FOR FIELD PROGRAMMABLE GATE ARRAYS

RELATED APPLICATION

This application is a continuation-in-part of, and claims the benefit under Title 35, United States Code, Section 120 of co-pending U.S. application Ser. No. 10/679,593 filed on Oct. 6, 2003 and entitled "METHOD AND APPARATUS FOR PERFORMING LAYOUT-DRIVEN OPTIMIZATIONS ON FIELD PROGRAMMABLE GATE ARRAYS".

TECHNICAL FIELD

The present invention relates to the field of field programmable gate arrays (FPGAs). More specifically, the present invention relates to a method and apparatus for performing post-placement functional decomposition on systems on FPGAs using tools such as electronic design automation (EDA) tools.

BACKGROUND

FPGAs may be used to implement large systems that include millions of gates and megabits of embedded memory. Of the tasks required in managing and optimizing a design, placement of components on the FPGAs and routing connections between components on the FPGA utilizing available resources can be the most challenging and time consuming. In order to satisfy placement and timing specifications, several iterations are often required to determine how components are to be placed on the target device and which routing resources to allocate to the components. The complexity of large systems often requires the use of EDA tools to manage and optimize their design onto physical target devices. Automated placement and routing algorithms in EDA tools perform the time consuming task of placement and routing of components onto physical devices.

The design of a system is often impacted by the connection delays routed along the programmable interconnect of the target device. The interconnect provides the ability to implement arbitrary connections, however, it includes both highly capacitive and resistive elements. The delay experienced by a connection is affected by the number of routing elements used to route the connection. Traditional approaches for reducing the delay were targeted at improving the automated placement and routing algorithms in the EDA tools. Although some reductions in delay were achieved with these approaches, the approaches were not able to perform further improvements to the system after the placement and routing phases. It is often only after the placement phase of the FPGA computer automated design (CAD) flow when connection delays are fully known.

Thus, what is needed is an efficient method and apparatus for performing layout-driven optimizations on FPGAs after the placement phase of the FPGA CAD flow.

SUMMARY

According to an embodiment of the present invention, critical sinks of a system are identified and alternative decompositions of the logic are examined for potential delay improvements after the placement of components in the system. According to one embodiment, pairs of logic elements on a critical path are examined for ways in which they may be re-synthesized to reduce the length of critical paths. The placed circuit is then modified to use the best decompositions found. If illegalities in placement exist, non-critical components are shifted in order to satisfy the preferred locations and produce a legal placement.

BRIEF DESCRIPTION OF THE DRAWINGS

The features and advantages of the present invention are illustrated by way of example and are by no means intended to limit the scope of the present invention to the particular embodiments shown, and in which:

FIG. 14 illustrates a decomposition chart according to an embodiment of the present invention;

DETAILED DESCRIPTION

Figure 1:
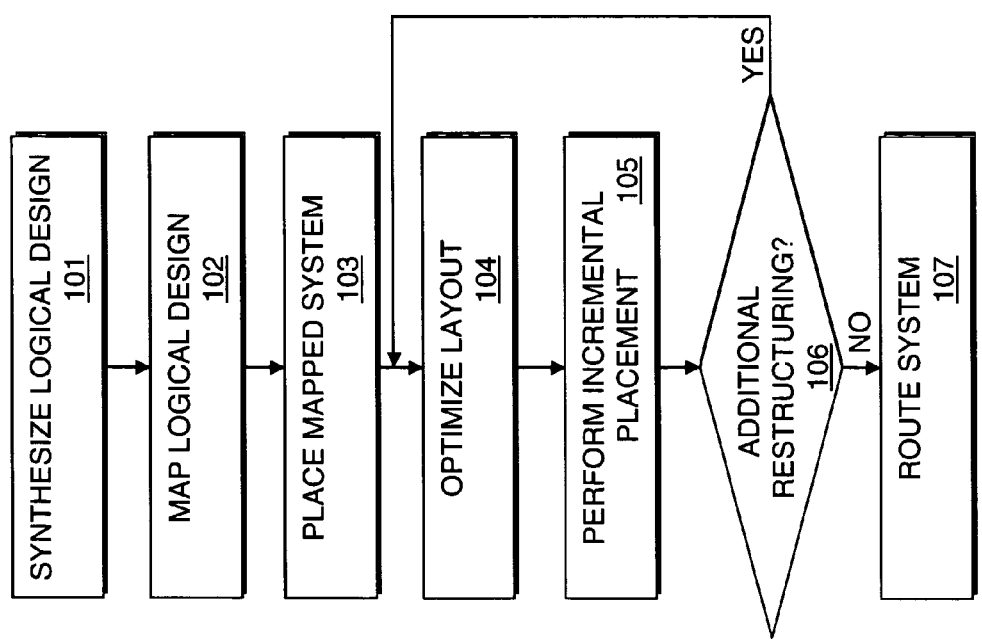
FIG. 1 is a flow chart illustrating a method for designing a system according to an embodiment of the present invention.

FIG. 1 is a flow chart that illustrates a method for designing a system according to an embodiment of the present invention. The method may be performed with the assistance of an EDA tool, for example. At 101, synthesis is performed. Synthesis includes generating a logic design of the system to be implemented by a target device. According to an embodiment of the present invention, synthesis generates an optimized logical representation of the system from a Hardware Description Language (HDL) design definition. The optimized logical representation of the system may include a representation that includes a minimized number of logic gates and logic elements required for the system. Alternatively, the optimized logical representation of the system may include a representation that has a reduced depth of logic and that generates a lower signal propagation delay.

Figure 2:
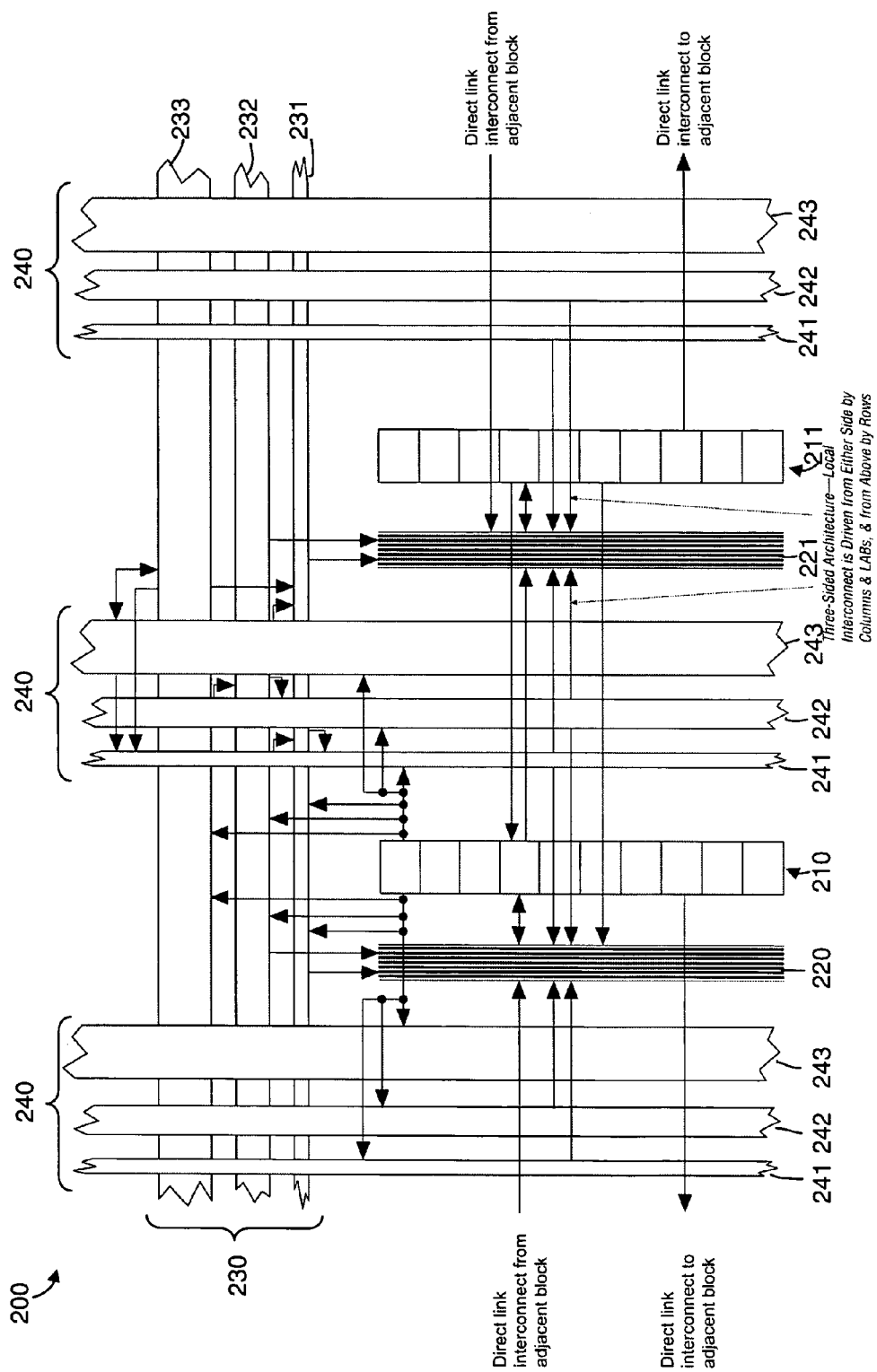
FIG. 2 illustrates a target device utilizing FPGAs according to an embodiment of the present invention.

FIG. 2 illustrates an exemplary target device 200 utilizing FPGAs according to an embodiment of the present invention. The present invention may be used to design a system onto the target device 200. According to one embodiment, the target device 200 is a chip having a hierarchical structure that may take advantage of wiring locality properties of circuits formed therein. The lowest level of the hierarchy is a logic element (LE) (not shown). An LE is a small unit of logic providing efficient implementation of user logic functions. According to one embodiment of the target device 200, an LE may include a 4-input lookup table (LUT) with a configurable flip-flop.

The target device 200 includes a plurality of logic-array blocks (LABs). Each LAB is formed from 10 LEs, LE carry chains, LAB control signals, LUT chain, and register chain connection lines. LUT chain connections transfer the output of one LE's LUT to the adjacent LE for fast sequential LUT connections within the same LAB. Register chain connection lines transfer the output of one LE's register to the adjacent LE's register within a LAB. LABs are grouped into rows and columns across the target device 200. A first column of LABs is shown as 210 and a second column of LABs is shown as 211.

The target device 200 includes memory blocks (not shown). The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 200.

The target device 200 includes digital signal processing (DSP) blocks (not shown). The DSP blocks may be used to implement multipliers of various configurations with add or subtract features. The DSP blocks include shift registers, multipliers, adders, and accumulators. The DSP blocks may be grouped into columns across the target device 200.

The target device 200 includes a plurality of input/output elements (IOEs) (not shown). Each IOE feeds an I/O pin (not shown) on the target device 200. The IOEs are located at the end of LAB rows and columns around the periphery of the target device 200. Each IOE includes a bidirectional I/O buffer and a plurality of registers for registering input, output, and output-enable signals. When used with dedicated clocks, the registers provide performance and interface support with external memory devices.

The target device 200 includes LAB local interconnect lines 220-221 that transfer signals between LEs in the same LAB. The LAB local interconnect lines are driven by column and row interconnects and LE outputs within the same LAB. Neighboring LABs, memory blocks, or DSP blocks may also drive the LAB local interconnect lines 220-221 through direct link connections.

The target device 200 also includes a plurality of row interconnect lines ("H-type wires") 230 that span fixed distances. Dedicated row interconnect lines 230, that include H4 231, H8 232, and H24 233 interconnects, route signals to and from LABs, DSP blocks, and memory blocks within the same row. The H4 231, H8 232, and H2 233 interconnects span a distance of up to four, eight, and twenty-four LABs respectively, and are used for fast row connections in a four-LAB, eight-LAB, and twenty-four-LAB region. The row interconnects 230 may drive and be driven by LABs, DSP blocks, RAM blocks, and horizontal IOEs.

The target device 200 also includes a plurality of column interconnect lines ("V-type wires") 240 that operate similarly to the row interconnect lines 230. The column interconnect lines 240 vertically routes signals to and from LABs, memory blocks, DSP blocks, and IOEs. Each column of LABs is served by a dedicated column interconnect, which vertically routes signals to and from LABs, memory blocks, DSP blocks, and IOEs. These column interconnect lines 240 include V4 241, V8 242, and V16 243 interconnects that traverse a distance of four, eight, and sixteen blocks respectively, in a vertical direction.

FIG. 2 illustrates an exemplary embodiment of a target device. It should be appreciated that a system may include a plurality of target devices, such as that illustrated in FIG. 2, cascaded together. It should also be appreciated that the target device may include programmable logic devices arranged in a manner different than that on the target device 200. A target device may also include FPGA resources other than those described in reference to the target device 200. Thus, while the invention described herein may be utilized on the architecture described in FIG. 2, it should be appreciated that it may also be utilized on different architectures, such as those employed by Altera® Corporation in its APEX™, and Mercury™ family of chips and those employed by Xilinx®, Inc. in its Virtex™ and Virtex™ II line of chips.

Figure 3:
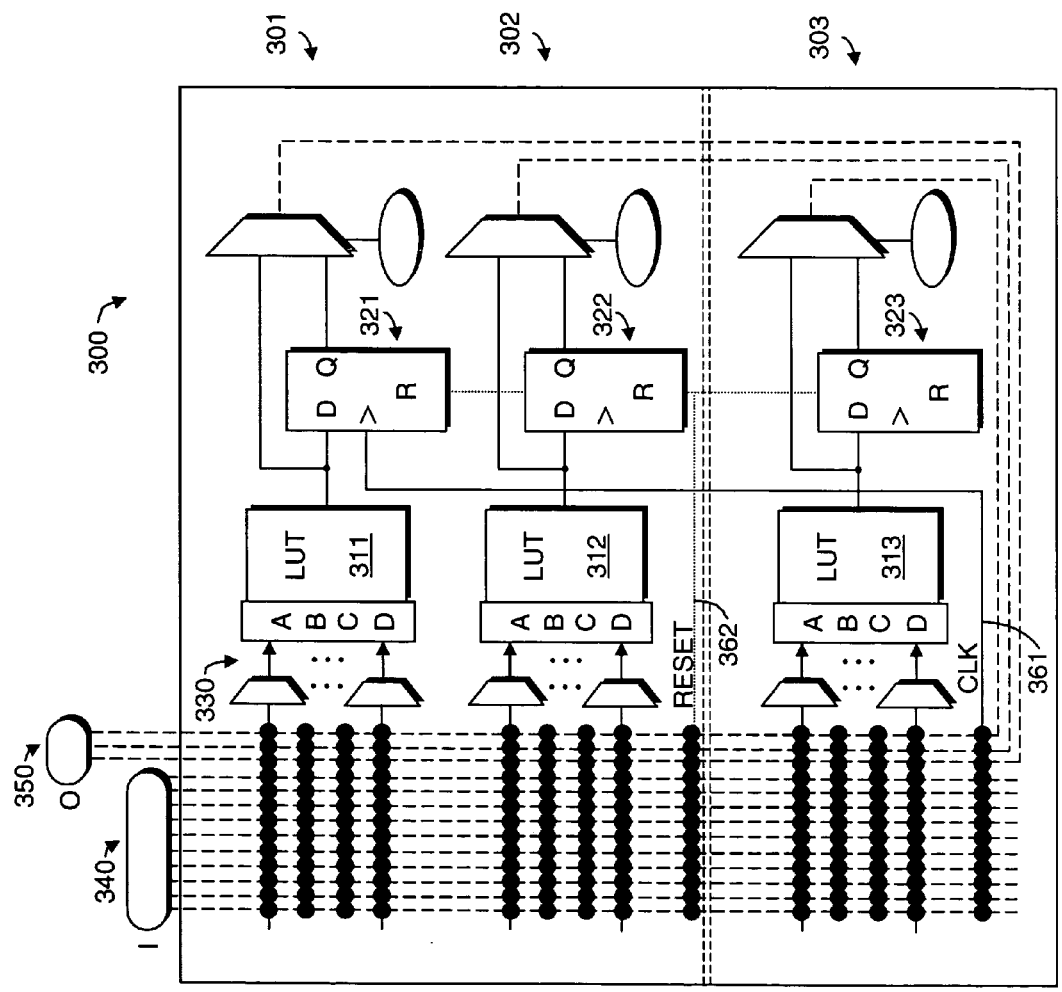
FIG. 3 illustrates a LAB according to an embodiment of the present invention.

FIG. 3 illustrates a LAB or clustered logic block 300 according to an embodiment of the present invention. The LAB 300 may be used to implement any of the LABs shown in FIG. 2. LEs 301-303 illustrates a first, second, and tenth LE in the LAB 300. The LEs 301-303 each have a 4-input lookup table 311-313, respectively, and a configurable register 321-323s, respectively, connected at its output. The LAB 300 includes a set of input pins 340 and a set of output pins 350 that connect to the general-purpose routing fabric so that LAB can communicate with other LABs. The inputs to lookup tables 311-313 can connect to any one of the input pins 340 and output pins 350 using the appropriate configuration bits for each of the multiplexers 330. The number of LEs, $n_E$, input pins, $n_1$, and output pins, $n_O$ in a LAB impose important architectural constraints on a system. In addition, since a single clock line 361 and a single asynchronous set/reset line 362 is attached to each configurable register 321-323, the configurable registers 321-323 must be clocked by the same signal and initialized by the same signal. The number of clock lines available in a LAB is represented by $n_C$. The number of reset lines available in a LAB is represented by $n_R$.

Referring back to FIG. 1, at 102, the optimized logical design of the signal is mapped. Mapping includes determining how to implement components such as logic gates and other logic components in the optimized logic representation with resources available on a target device. According to an embodiment of the present invention, a netlist is generated from mapping. The netlist illustrates how the resources of the target device are utilized to implement the system. The netlist may, for example, include a representation of the components on the target device and how the components are connected. Mapping may include, for example, determining how components may be implemented using LEs. The components may include, for example, digital logic such as logic gates, memory devices, and/or other components. Mapping may also include, for example, determining which LEs should be packed together in a LAB. Although the resources on a target device are assigned for implementing the components, the specific resources and their locations are not assigned in 102.

At 103, the mapped logical system design is placed. Placement includes fitting the system on the target device by determining which resources (and their location) on the target device is to be used for specific components and connections between the components. The placement procedure may be performed by a placer in an EDA tool that utilizes placement algorithms. According to an embodiment of the present invention, a user (designer) may provide input to the placer by specifying placement constraints. The constraints may include defining logic regions that group certain components of a system together. The size of the logic regions may be determined by the user or by a sizing method. The placement of the logic regions may be determined by the user or by a placement method.

At 104, layout-driven optimizations are performed. According to an embodiment of the present invention, routing delays for the connections on the netlist are estimated by calculating a fastest possible route. Timing-driven netlist optimization techniques may be applied to perturb the netlist to reduce the critical path(s). The netlist may be perturbed by the EDA tool performing the synthesis, mapping and placement. Alternatively, the netlist may be perturbed by a user of the EDA tool, or by a third party. Perturbing the netlist may include adding, deleting, or moving components.

According to an embodiment of the present invention, optimization of the layout of the system may be achieved by performing Shannon's Decomposition Theorem to critical sections of the system. Consider an n-input function $f(x_0, \ldots, x_i, \ldots, x_n)$. Shannon's Decomposition Theorem allows the n-input function to be expressed in the following manner.

$$f(x_0, \ldots, x_i, \ldots, x_n) = x_i f(x_0, \ldots, 0, \ldots, x_n) + x_i f(x_0, \ldots, 1, \ldots, x_n) \quad (1)$$

In this embodiment, critical components of the system used for processing a critical signal, $x_i$, may be identified and expanded. The critical signal may be, for example, a signal that impacts the processing of many other signals in the system or a signal that may affect the timing of the system if the propagation delay of that signal is increased. In this embodiment, a critical path is a path from source to sink, that includes critical signals via components (vertices) and wires (edges). Expansion includes making duplicate copies of the components. The duplicate copies of the components generate pre-computed function values dependent on possible values of the critical signal. The pre-computed function values may be determined for $x_i=0$ and $x_i=1$. An appropriate pre-computed function value may be selected in response to the critical signal when it arrives. According to an embodiment of the present invention, preferred locations are identified for the duplicate copies of the components and the locations assigned to components of the existing system from the placement procedure are identified as preferred locations for the components.

Figure 4:
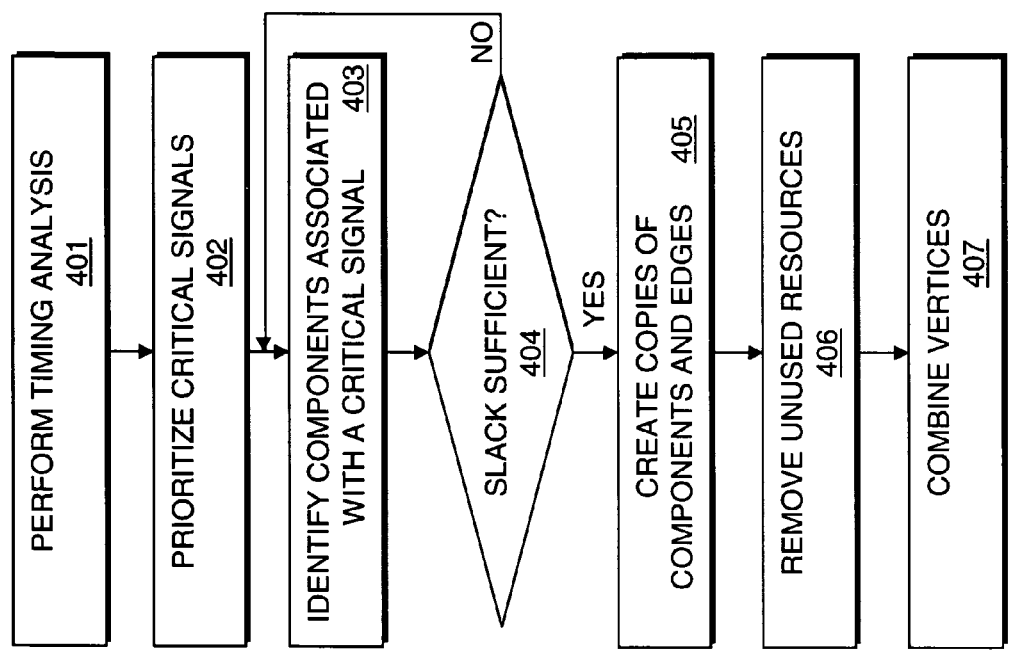
FIG. 4 is a flow chart illustrating a method for performing layout-driven optimization according to an embodiment of the present invention.

FIG. 4 is a flow chart illustrating a method for performing layout-driven optimization according to an embodiment of the present invention. The method shown in FIG. 4 may be used to implement 104 shown in FIG. 1. At 401, timing analysis is performed on the system. For each edge, eg, that serves as a connection in the system, a criticality value crit(eg) is assigned based on the timing analysis. The criticality value of a connection indicates how significant the connection impacts the final speed at which the circuit can operate. According to an embodiment of the present invention, the system on the target device may be represented by a directed acyclic graph, G(V,Eg), where V is a group of vertices representing the components or combinational elements, and Eg is a group of edges representing routing connections between vertices in the system. According to one embodiment an -graph G(V,Eg) is a subgraph of the combinational graph G(V,Eg), where the edge set Egis a set of edges that have criticality values within a value $\epsilon$ of being the most critical, and Vare a set of vertices that have an adjacent edge having a criticality value within of being the most critical.

At 402, the critical signals in the system are identified. According to an embodiment of the present invention, a cost function is utilized. The cost function quantifies a number of critical or near critical paths that a particular vertex affects. Illustratively, this quantity is denoted with a label named "cpcount", or critical path count, for each vertex. The cpcount identifiers for each vertex are initially set to zero. For each sink vertex in $G_\epsilon$, the following procedure is performed.

procedure traceback (sink)
begin
  u=sink
  while u≠0
    cpcount (u)=cpcount(u)+1
    u=0
    foreach $eg_{wu} \in$ FANIN (u)
      choose fanin with maximum crit($eg_{wu}$) and assign
        u=w
    end for
  end loop
end procedure This procedure takes a sink vertex and traverses the most critical fanins (FANIN) backwards to find a single critical path that involves the sink vertex. The criticality value is used to determine the most critical fanout at each vertex. Each vertex along the path traced backwards has its cpcount identifier incremented. After this procedure has been performed for all sink vertices, the vertices that have the higher cpcount values are determined to affect the larger numbers of critical sinks. It should be appreciated that this procedure is heuristic in nature as there may be several different near critical paths that affect a sink vertex, instead of the single path that is traced backwards. Nevertheless, this procedure is an efficient and effective method for identifying veritces that affect the largest number of critical paths.

Figure 5:
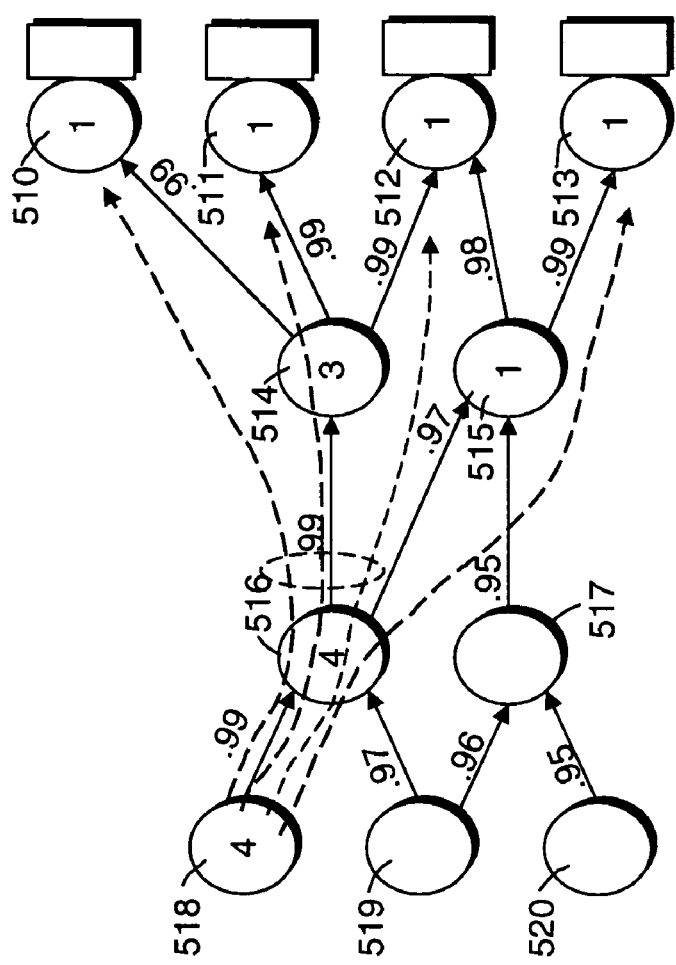
FIG. 5 illustrates critical path traceback performed on exemplary vertices and edges according to an embodiment of the present invention.

FIG. 5 illustrates the critical path traceback procedure performed on exemplary vertices and edges in the system according to an embodiment of the present invention. Nodes 510-520 represent vertices in the system. The solid arrow lines represent edges that connect the nodes. Each edge has its corresponding criticality value labeled next to it. The dashed arrow lines represent tracebacks from critical sink vertices. In this example, nodes 516 and 518 affects 4 critical sinks and thus the signals associated with nodes 516 and 518 are determined to have an associated cpcount value of 4. It should be appreciated that signals having an associated cpcount value over a predetermined threshold value may be designated as being critical signals and be prioritized in order of their degree of criticality.

According to an embodiment of the present invention, the critical signals in the system are sorted and prioritized according to their associated cpcount value. The critical signal with the highest cpcount value is designated to be the most critical of the critical signals. The critical signal with the lowest cpcount value over the predetermined threshold value is designated the least critical of the critical signals. According to an alternate embodiment of the present invention, a cost function is utilized to determine the degree of criticality of the critical signals. In this embodiment, the cost function takes into account the cpcount value and other criteria.

At 403, components associated with a critical signal are identified. According to an embodiment of the present invention, to identify all critical vertices that are affected by a critical signal, the transitive fanouts of the critical signal are examined.

Figure 6:
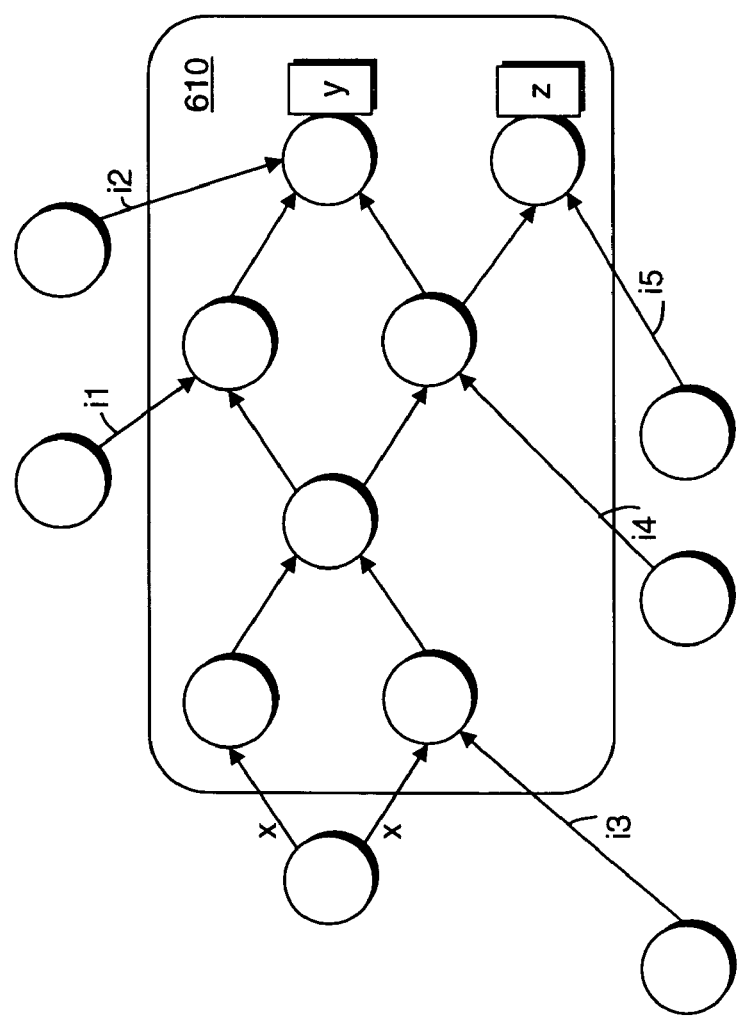
FIG. 6 illustrates the transitive fanouts associated with a critical signal according to an embodiment of the present invention.

Consider the following illustrative example. FIG. 6 illustrates a portion of combinational graph G(V,Eg) where signal x is identified as being a critical signal. A vertex v is a transitive fanout of x if there exists a path from x to v in the subgraph $G_\epsilon$. This may be denoted as $v \in TF_\epsilon(x)$. In FIG. 6, the transitive fanouts of signal x in $G_\epsilon$ are encapsulated in rectangle labeled 610. The signal x affects two critical signals y( . . . , x, . . . ) and z( . . . , x, . . . ).

Referring back to FIG. 4, at 404, it is determined whether sufficient slack exists for performing duplication on the components associated with the critical signal. While applying Shannon's Decomposition Theorem may be beneficial for signals emanating from x, the side effects of the operation need to be considered. Consider the fanins labeled $i_1$-$i_5$ in FIG. 6. After applying Shannon's Decomposition Theorem to the components associated with the critical signals, signals downstream from these components experience an extra level of logic delay due to select logic added at the sink nodes. This extra level of logic delay is acceptable as long as the slack on the connections $i_1$-$i_5$ is greater than the amount of delay introduced by the select logic and the routing delay needed to connect to the select logic. The side-input set I may be used to represent the fanin edges of $TF_\epsilon(x)$ whose source vertex is not an intermediate variable in $TF_\epsilon(x)$. I includes all external input edges to $TF_\epsilon(x)$. According to an embodiment of the present invention, Shannon's Decomposition Theorem may be applied as long as the following condition is satisfied.

$$\forall i \in I,\ slack(i) \geq selector\ delay + routing\ delay\ to\ selector \quad (2)$$

If sufficient slack exists, control proceeds to 405. If sufficient slack does not exist, control returns to 403 where components associated with a next critical signal are identified.

Figure 7:
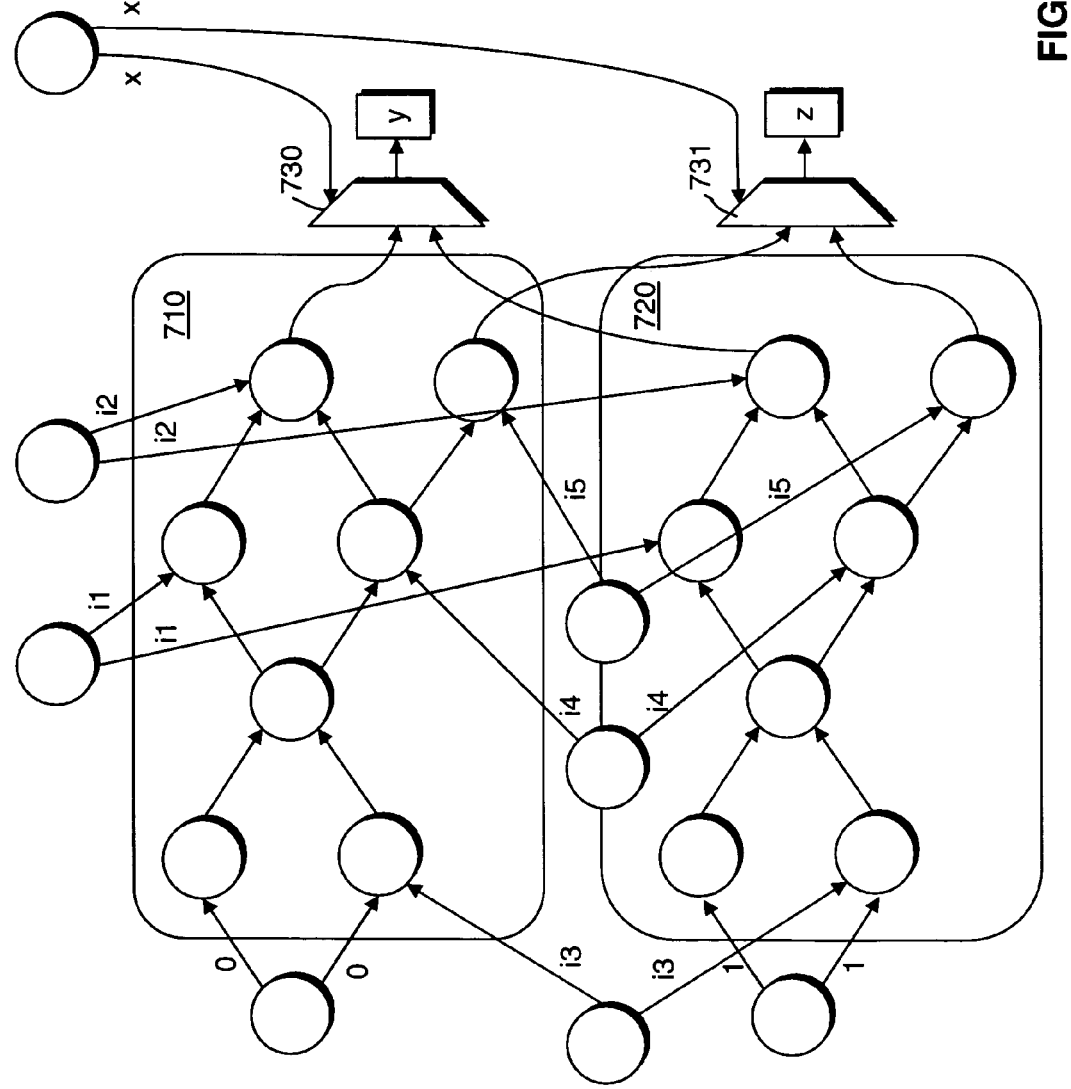
FIG. 7 illustrates the duplication of critical components according to an embodiment of the present invention.

At 405, copies of the components associated with the critical signal are generated. A first and second copy of the vertices identified in the transitive fanout of the critical signal are made. Referring to the example illustrated in FIG. 6, a first copy of the vertices will be used to evaluate y and z for x=0. The second copy of the vertices will be used to evaluate y and z for x=1. Consider a vertex $v \in TF_\epsilon(x)$. A duplicate version is required to evaluate y and z for x=0. This duplicated vertex is denoted as $v_0$. A duplicate version is required to evaluate y and z for x=1. This duplicated vertex is denoted as $v_1$. FIG. 7 illustrates the duplication of components associated with a critical signal according to an embodiment of the present invention. Vertices in rectangle area 710 represent the first copy of the components. Vertices in rectangle area 720 represent the second copy of the components.

At 405, edges are also added to connect the appropriate vertices together. For each vertex $v \in TF_\epsilon(x)$, the following procedure is performed to generate the required edges. For every edge $eg_{uv} \in FANIN(v)$, if $u \in TF_\epsilon(x)$, create an edges from $u_0$ to $v_o$ and from $u_1$ to $v_l$. Referring to the example in FIG. 7, this procedure wires together the intermediate signals used to compute y and z for x=0 and x=1. For every edge $eg_{uv} \in FANIN(v)$, if $u \notin TF_\epsilon(x)$, create a new edge from u to $v_o$ and a new edge from u to $v_1$. Referring to the example in FIG. 7, this procedure wires the input signals into the components that compute y( . . . 0 . . . ), y( . . . 1 . . . ), z( . . . 0 . . . ), and z( . . . 1 . . . ).

At 405, a selector is also added to select an appropriate output from the first and second copies. The selector selects the appropriate output in response to the critical signal which the decomposition was based. Referring to the example in FIG. 7, the selectors are shown as 730 and 731.

Figure 8:
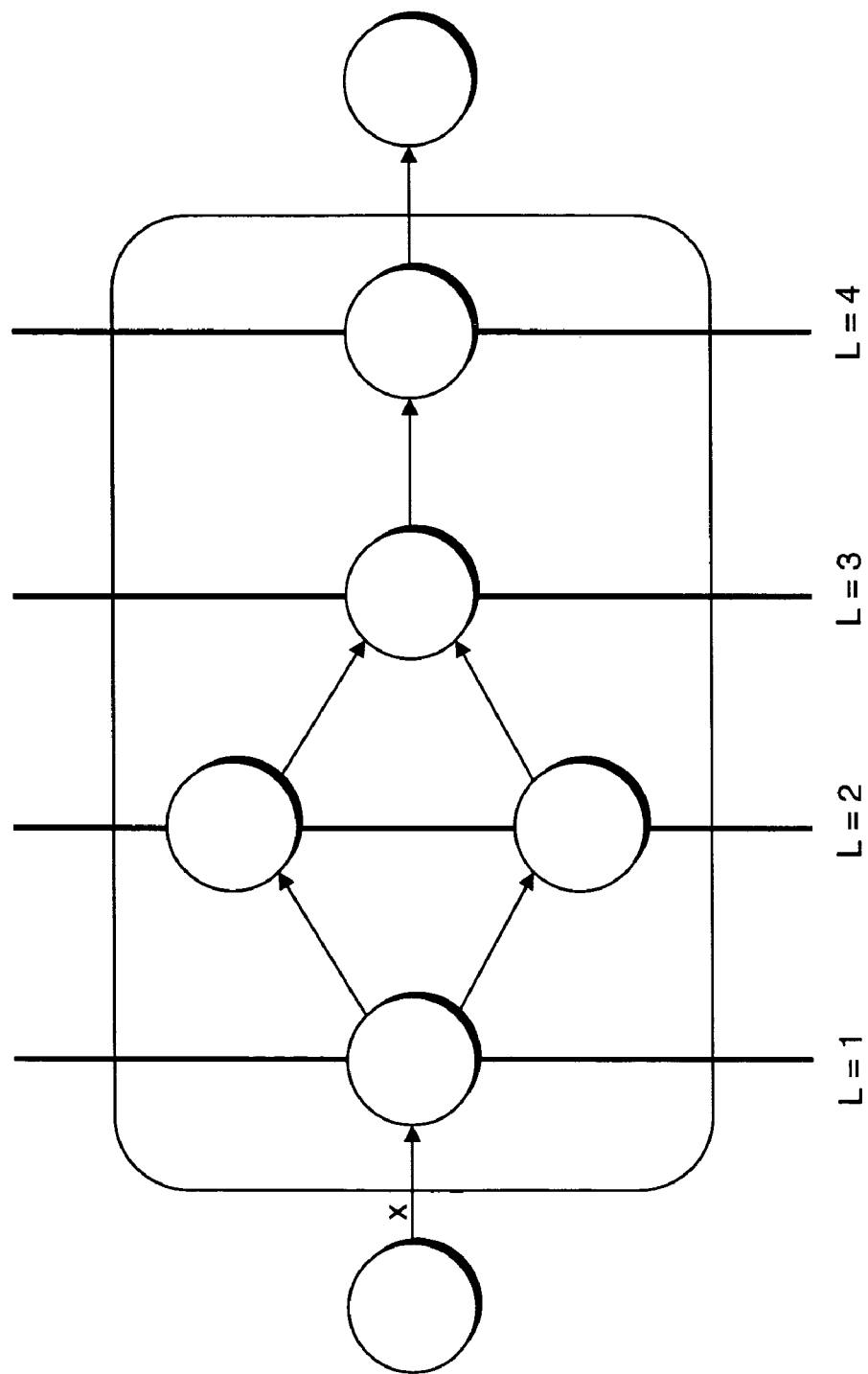
FIG. 8 illustrates logic levels relative to signal x for the purpose of controlling vertex duplication according to an embodiment of the present invention.

The procedure described involves the duplication of each vertex in $TF_\epsilon(x)$. It should be appreciated that this set size may be controlled by redefining the critical transitive fanout set. According to an embodiment of the present invention, each vertex $v \in TF_\epsilon(x)$ is associated with a label l(v) that is set to a maximum number of logic levels between x and v. The set $TF_\epsilon(x,D)$ represents all vertices v where there exists a path from x to v and $l(v) \leq D$. FIG. 8 illustrates logic levels relative to signal x for the purposes of controlling vertex duplication according to an embodiment of the present invention. The value of D controls the tradeoff between the amount of duplication allowed and the number of levels of logic delay removed from critical paths. It should be appreciated that $TF_\epsilon(x,)$ may be replaced with $TF_\epsilon(x,D)$ for 403-406. According to one embodiment, D has the value 3.

Figure 9:
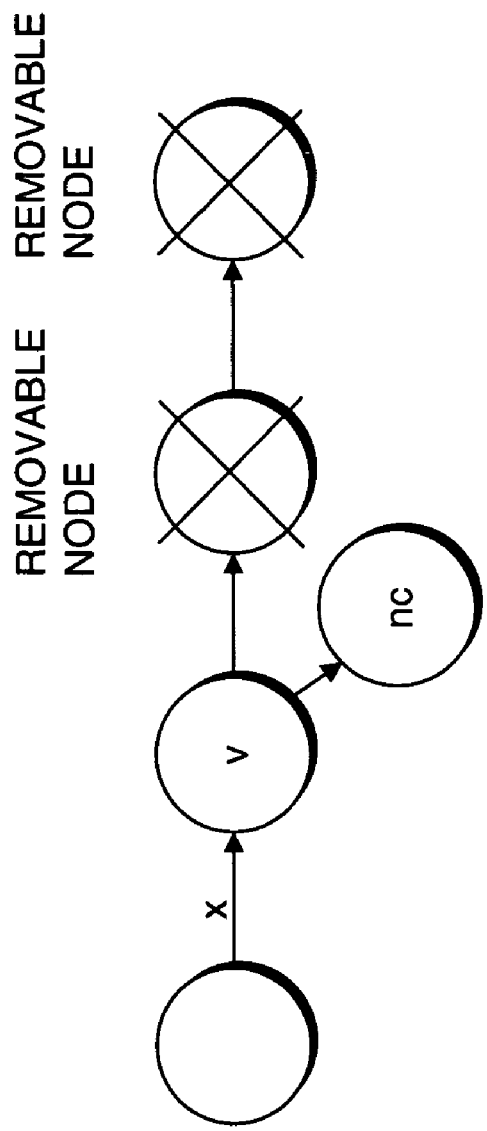
FIG. 9 illustrates an example of unused vertices according to an embodiment of the present invention.

Referring back to FIG. 4, at 406, unused resources from the original system design are removed. According to an embodiment of the present invention, unused components and unused wires for routing connections associated with the critical signal are removed. When the transitive fanout of x, $v \in TF_\epsilon(x)$, is duplicated, copies $v_o$ and $v_1$ are generated for every v. Referring to the example shown in FIG. 6, some of the non-duplicated components are no longer needed because the first and second copies serve to produce the functions y and z. However, if any of the components are vertices $v \in TF_\epsilon(x)$ is used as an input to another function nc( . . . v . . . ) such that $n \notin TF_\epsilon(x)$, then the vertex v cannot be removed or deleted. FIG. 9 illustrates exemplary components associated with a critical signal x, where some components may be removed and others may not according to an embodiment of the present invention. Thus, a vertex $v \in TF_\epsilon(x)$ may be removed only if $TF(v) \subseteq TF_\epsilon(x)$.

At 407, the design for the system is evaluated to determine whether vertex collapsing may be performed. Depending on the architecture for the target device, multiple vertices may be implemented with a single vertex. According to an embodiment of the present invention, the target device implements a logic element having a 4-input lookup table. Thus in this embodiment, vertices may be arbitrarily collapsed into a single vertex as long as the new vertex requires four or fewer inputs. Collapsing multiple vertices into a single vertex reduces the number of levels of logic delay for a signal and recovers some of the area utilized for component duplication.

Referring back to 104 in FIG. 1, it should be appreciated that optimization of the layout of the system may be achieved by performing functional decomposition to critical sections of the systems. According to an embodiment of the present invention, critical sinks of a system are identified and alternative decompositions of the logic in those critical sections are examined for potential delay improvements. According to one embodiment, pairs of LEs associated with the critical sections are examined for ways in which they may be re-synthesized to reduce the length of critical paths. The placed circuit is then modified to use the best decompositions found.

Figure 10:
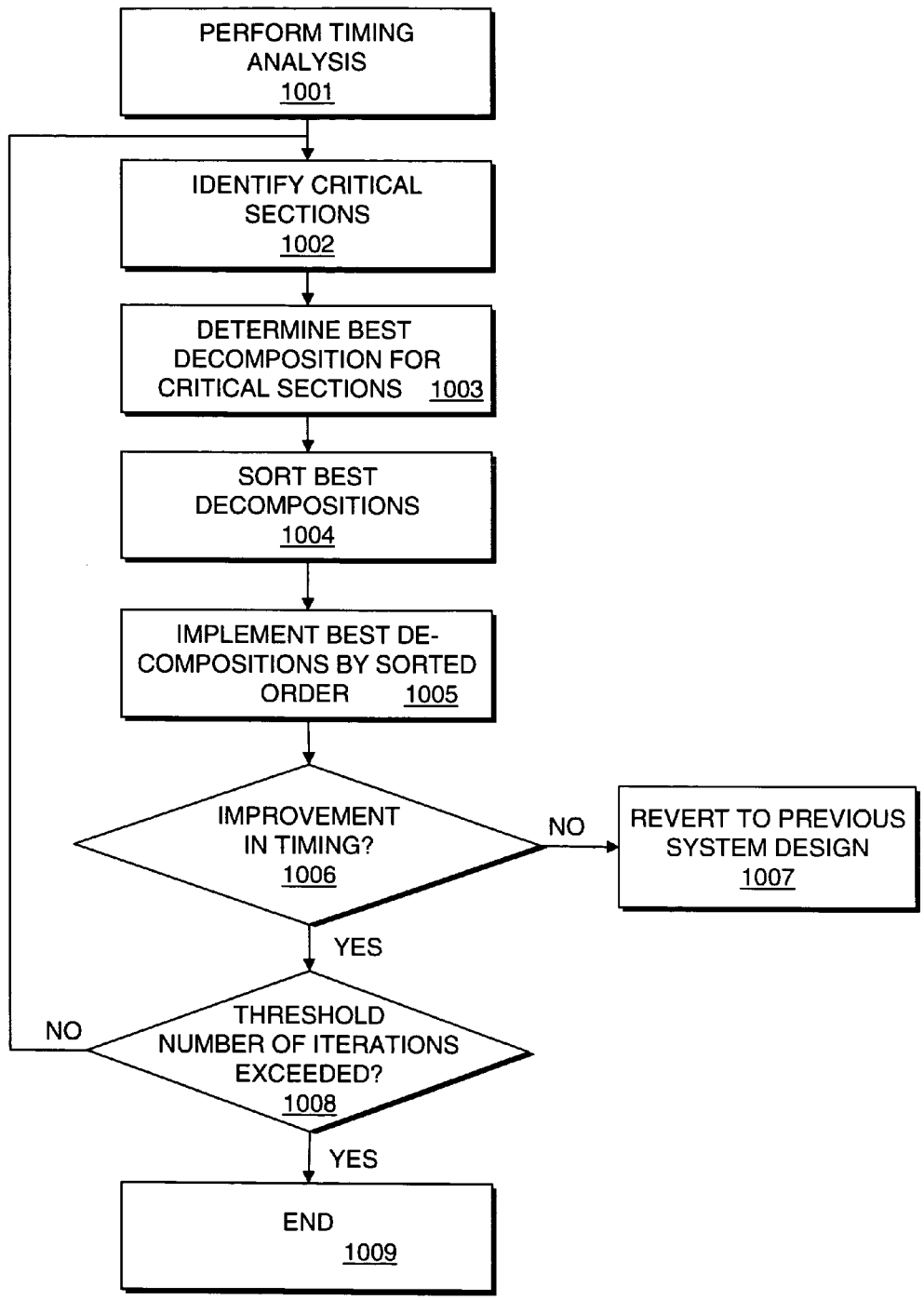
FIG. 10 is a flow chart illustrating a method for performing post-placement functional decomposition according to an embodiment of the present invention.

FIG. 10 is a flow chart illustrating a method for performing post-placement functional decomposition according to an embodiment of the present invention. The method shown in FIG. 10 may be used to implement 104 shown in FIG. 1. At 1001, timing analysis is performed on the system to determine the timing of the system. The timing analysis uses approximations since routing has not yet been performed. According to an embodiment of the present invention, timing analysis determines wire delay assuming that the best possible routes will be used for each connection in the system. Timing analysis establishes the length of the critical path as well as the slack for each sink (which is equivalent to the slack of the path to the sink). Slack may be defined to be the amount of delay that can be added to a path before it becomes critical. According to an embodiment of the present invention, timing analysis may be performed as described with reference to 401 shown in FIG. 4.

Figure 11:
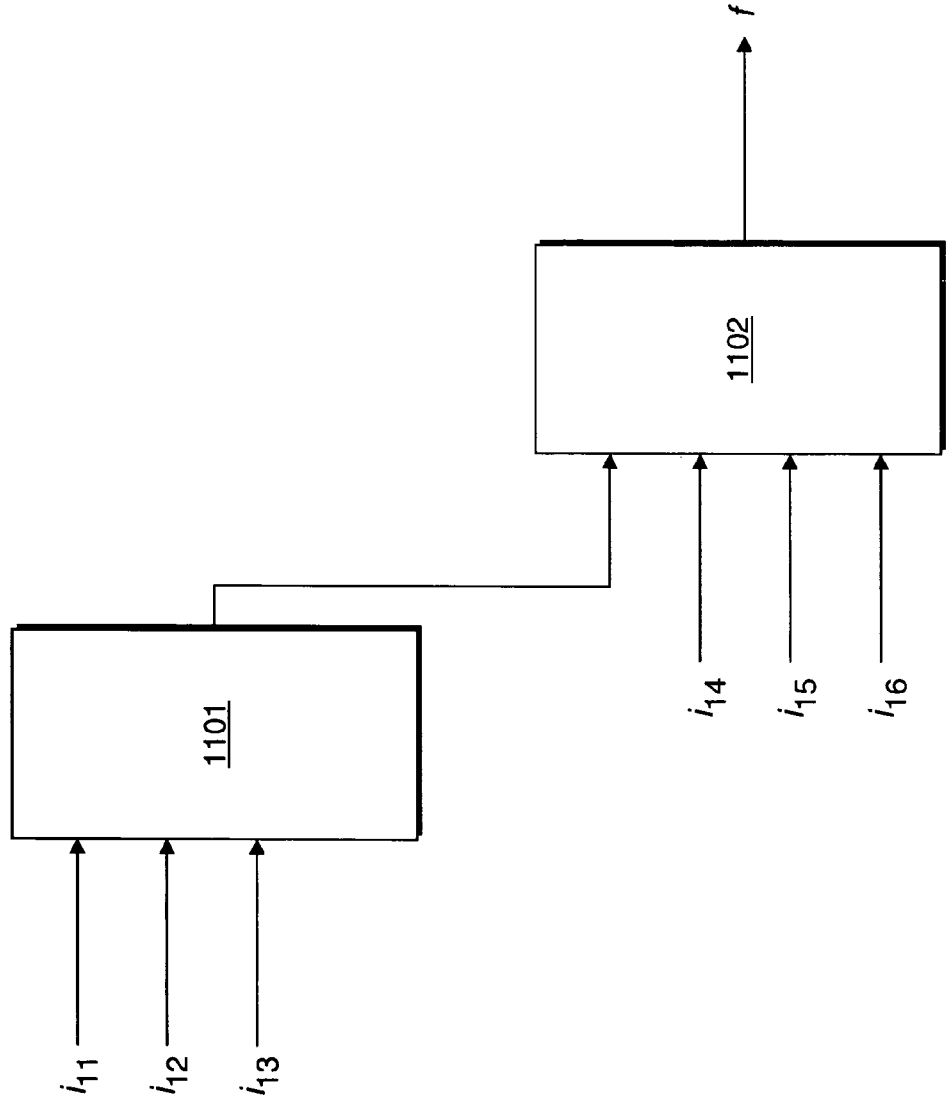
FIG. 11 illustrates exemplary FPGA resources that are associated with a critical section according to an embodiment of the present invention.

At 1002, critical sections are identified. According to an embodiment of the present invention, critical sections are identified by first identifying near critical sinks. A near critical sink may be defined as a sink with a slack value below a threshold value. FPGA resources around the near critical sinks satisfying a predefined characteristic are designated as being a critical section. In one embodiment, the predefined characteristic may be, for example, two cascaded LEs that include a first LE that is a near critical sink and a second LE that is driven by the near critical sink. It should be appreciated that other embodiments of the present invention may have other predefined characteristics. FIG. 11 illustrates two cascaded LEs that may be associated with a near-critical sink. A first LE 1101 includes a plurality of connections (inputs) $i_{11}$-$i_{13}$. A second LE 1102 includes a plurality of inputs $i_{14}$-$i_{16}$ and an output from LE 1101.

At 1003, a best decomposition is determined for each of the critical sections. A best decomposition for a critical section reduces the critical path(s) for the system by improving the timing for critical or near critical paths through the critical section. The best decomposition may swap one or more inputs to a first FPGA resource in a critical section with one or more inputs to a second FPGA resource in the critical section and reconfigure the first and second FPGA resources. Reconfiguring the FPGA resources may involve adding, deleting, or moving components implemented by the FPGA resources.

Figure 12:
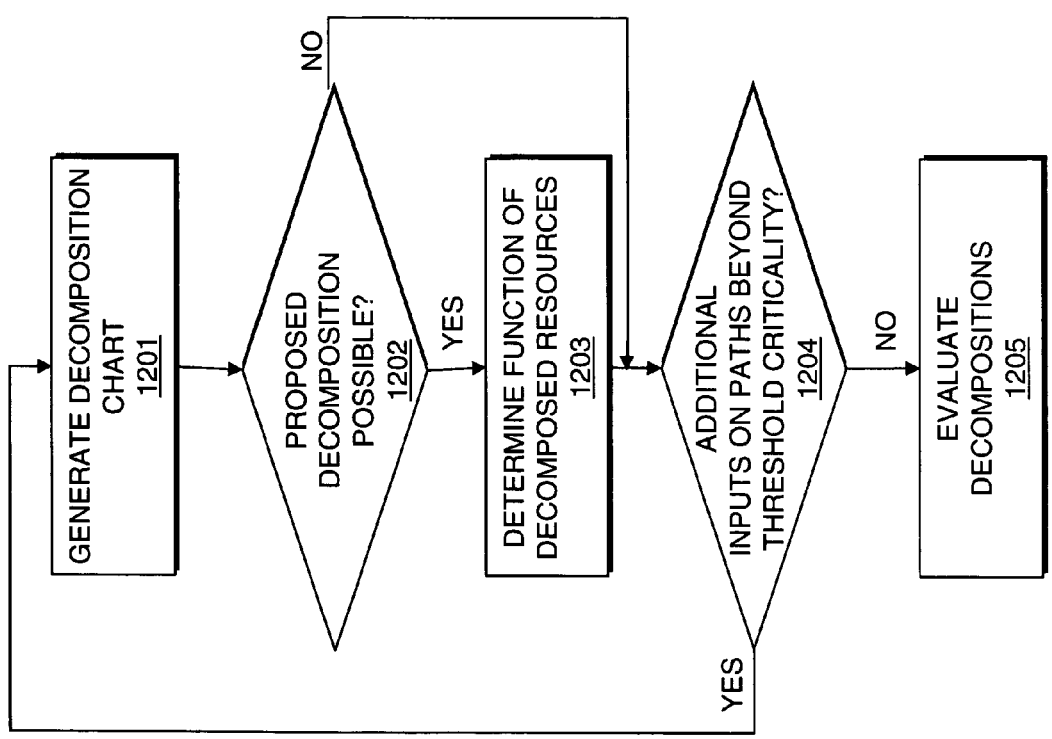
FIG. 12 is a flow chart illustrating a method for determining a best decomposition for a critical section according to an embodiment of the present invention.

FIG. 12 is a flow chart illustrating a method for determining a best decomposition for a critical section according to an embodiment of the present invention. The method shown in FIG. 12 may be used to implement 1003 shown in FIG. 10. At 1201, a decomposition chart is generated for a proposed decomposition for a critical section. The proposed decomposition for a critical section may be based on swapping one or more inputs to a first FPGA resources with one or more inputs to a second FPGA resource in the critical section where the one or more inputs to the FPGA resources are on paths that have a criticality beyond a threshold level. A decomposition chart is generated only for a proposed decomposition that has not been previously considered.

Figure 13:
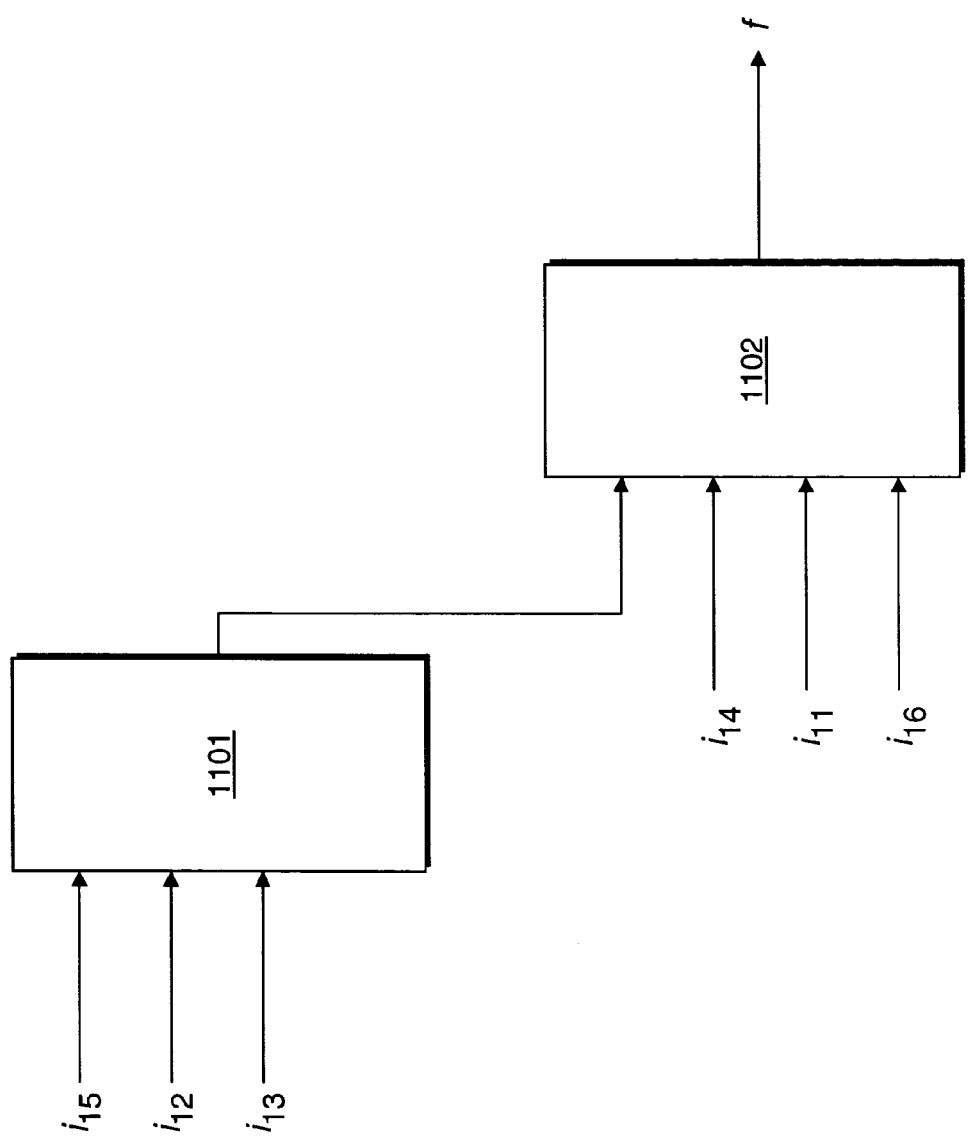
FIG. 13 illustrates a proposed decomposition for the critical section shown in FIG. 11.

A proposed decomposition for the critical section shown in FIG. 11 is illustrated in FIG. 13. The proposed decomposition moves input $i_{11}$ to LE 1102 and input $i_{15}$ to LE 1101. By swapping input $i_{11}$ with input $i_{15}$, the delay associated with having the input $i_{11}$ processed at LE 1101 and transmitting the output of LE 1101 to LE 1102 is exchanged for the delay associated with having the input $i_{15}$ processed at LE 1101 and transmitting the output of LE 1101 to LE 1102. This exchange may improve the timing of the system if input $i_{15}$ has a higher slack value than input $i_{11}$. The decomposition chart illustrates the outputs of the proposed decomposition for given inputs.

FIG. 14 illustrates an exemplary decomposition chart 1400 according to an embodiment of the present invention. The decomposition chart 1400 is a 6 variable decomposition chart illustrating the proposed decomposition shown in FIG. 13. The input signals feeding the first LE 1101 are arranged along the columns of the decomposition chart 1300. The input signals feeding the second LE 1102 are arranged along the rows of the decomposition chart 1300. An output of the critical section generated by the second LE 1102 may be found by cross referencing the rows and columns of the appropriate input signals.

At 1202, it is determined whether the proposed decomposition for the critical section is possible. According to an embodiment of the present invention, a decomposition is determined to be possible if no more than two distinct column patterns appear in the decomposition chart generated at 1201. If it is determined that the proposed decomposition for the critical section is possible, control proceeds to 1203. If it is determined that the proposed decomposition for the critical section is not possible, control proceeds to 1204.

It should be appreciated that a determination may be made when inputs to the FPGA resources in a proposed decomposition are not unique and are shared amount the FPGA resources. These proposed non-disjoint decompositions may be evaluated differently. For example, when generating a decomposition chart for a proposed non-disjoint decomposition, a "don't care" output would be indicated in positions on the decomposition chart where non-disjoint input signals have differing values. The "don't care" values may be interpreted as being either a 1 or 0 when determining if no more than two distinct column patterns are present with respect to 1202.

Referring back to FIG. 12, at 1203, functions for the decomposed FPGA resources are determined. According to an embodiment of the present invention, functions for the decomposed FPGA resources may be derived from the decomposition chart generated at 1201. A function that selects between the two distinct columns may be implemented for a first FPGA resource. A function that outputs the required column may be implemented for the second FPGA resource.

Figure 15A:
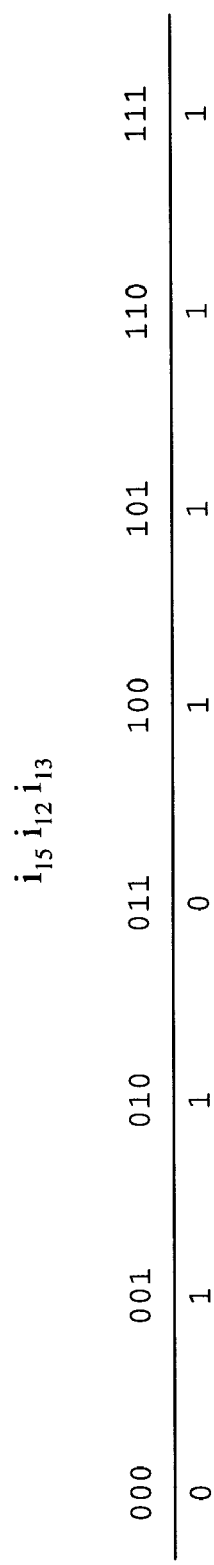
FIG. 15a is a chart illustrating a function for a first LE in a proposed decomposition.
Figure 15B:
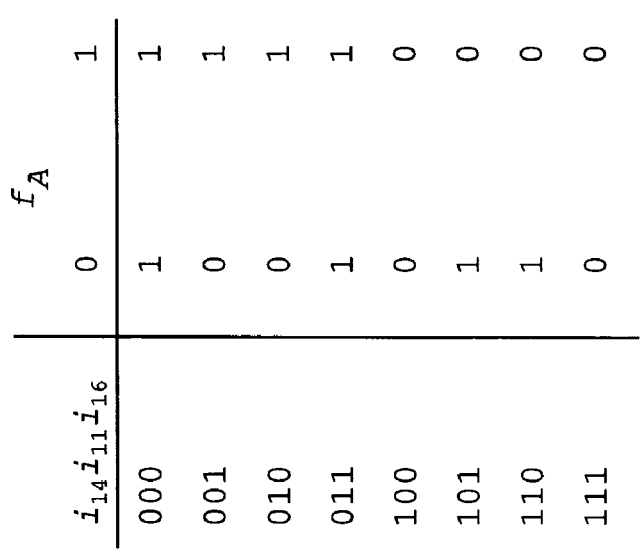
FIG. 15b is a chart illustrating a function for a second LE in a proposed decomposition.

An example of functions for the proposed decomposition shown in FIG. 13 is shown in FIGS. 15a and 15b. FIG. 15a is a table illustrating a function for LE 1101 shown in FIG. 13. A first column type from the decomposition chart shown in FIG. 14 is encoded as 0. A second column type from the decomposition chart shown in FIG. 14 is encoded as 1. FIG. 15b is a table illustrating a function for LE 1102 shown in FIG. 13. LE 1102 uses the output from LE 1101 ($f_A$) to select between the two distinct columns shown in FIG. 14.

Referring back to FIG. 12, at 1204, it is determined whether all inputs on paths having a criticality beyond the threshold level have been considered for functional decomposition. If not all inputs on paths having criticality beyond the threshold level have been considered for functional decomposition, control proceeds to 1201. If all inputs on paths having a criticality beyond the threshold level have been considered for functional decomposition, control proceeds to 1205.

It should be appreciated that the proposed decomposition for a critical section may be based on swapping one or more inputs to a first FPGA resources with one or more inputs to a second FPGA resource in the critical section regardless of the criticality of the paths associated with the one or more inputs. In this embodiment, all possible decompositions of the input function of the critical section may be considered. According to an embodiment of the present invention, a determination as to whether to consider all possible decompositions of the critical section or only possible decompositions of the critical section involving swapping inputs on paths with a criticality over a threshold value is based on a number of inputs to the FPGA resources in the critical section.

At 1205, the proposed decompositions that are possible as determined in 1202 are evaluated and a best decomposition is selected. The best decomposition may be selected using a cost function that evaluates a decomposition based on its overall effect on the critical section and its individual effect on each input. An exemplary cost function may be defined with the relationships below.

The slack on a path associated with an input i before and after decomposition is denoted $t_i$ and $t'_i$, respectively. The criticality of a path associated with an input depends on the maximum slack in the circuit, $t_{max}$, and the initial slack on the path as shown below.

$$r_i = 1 - (t_i/t_{max}) \quad (3)$$

The gain of an input i as a result of decomposition may be described by its criticality and change in slack as shown in the relationship below.

$$g_i = r_i^e(t'_i - t_i) \quad (4)$$

The variable e determines the relative importance of criticality to the cost function.

The overall effect of the decomposition on the FPGA resources in the critical section is also considered. In the example where the FPGA resources that defined a critical section are two cascaded LEs, the minimum slack on the paths to the LEs before and after decomposition is considered and denoted $t_{A,B}$ and $t'_{A,B}$, respectively. The criticality and gain are described with the following relationships.

$$r_{A,B} = 1 - (t_{A,B}/t_{max}) \quad (5)$$

$$g_{A,B} = r_{A,B}^e(t'_{A,B} - t_{A,B}) \quad (6)$$

The cost of a decomposition may be defined as a weighted sum of the overall effect on the LEs and the individual effect on each input as shown below in (7). The variable k is a parameter that determines the relative importance of the two components. Decompositions with higher values of c are preferred and decompositions with a negative value of c are rejected.

$$c = \lambda g_{A,B} + (1-\lambda)\Sigma_i g_i \quad (7)$$

Referring back to FIG. 10, at 1004 the best decompositions are sorted. According to an embodiment of the present invention, the best decompositions are sorted from best to worst utilizing the criteria used in 1205 with reference to FIG. 12.

At 1005, the best decompositions are implemented according to the order sorted. It should be appreciated that the best decompositions may not be mutually exclusive and that some decompositions may interfere with others. Best decompositions that have the highest cost are implemented first and over best decompositions that have a lower cost and that have conflict with a higher ranked decomposition.

At 1006, it is determined whether the timing of the system has improved with the implementation of the best decompositions. A timing analysis may be performed to determine the timing of the modified system design and the effect of the changes on the critical path. The timing of the modified system design may be compared with the timing of the original system design determined at 1001. If the timing of the system has not improved, control proceeds to 1007. If the timing of the system has improved, control proceeds to 1008.

At 1007, the modifications to the original system design are not implemented.

At 1008, it is determined whether a threshold of iterations for 1002-1008 has been performed. If a threshold number of iterations for 1002-1008 has not been performed, control returns to 1002. If a threshold number of iterations for 1002-1008 has been performed, control proceeds to 1009.

At 1009, control terminates the process.

Referring back to FIG. 1, at 105, incremental placement is performed. The changes to the netlist generated from layout-driven optimization are placed on the layout of the existing system placed at 103. Incremental placement involves evaluating resources on a target device such as LABs that have architectural violations or illegalities from layout-driven optimizations. Incremental placement attempts to perturb the preferred locations as little as possible to ensure that the final placement respects all architectural constraints. Incremental placement attempts to identify non-critical LEs that may be moved from their preferred locations to resolve architectural violations in order that truly critical elements may stay at their preferred locations. Incremental placement may be performed by an incremental placement engine (not shown) in the EDA tool that utilizes incremental placement algorithms.

In performing incremental placement, an architectural description of the target device, A, and a netlist, N(E,C), that includes a set of logic elements, E, and a set of connections, C, is processed. Each element, e, is associated with a preferred physical location, ($p_x(e)$, $p_y(e)$). According to an embodiment of the present invention, all atoms of the netlist have a preferred location. Incremental placement generates a set of mapped locations, M, for each logic elements in N. Incremental placement tries to find a mapping from preferred locations to mapped locations, P→M, such that the mapped locations are architecturally feasible as well as being minimally disruptive. The definition of minimal disruption depends on the goal of netlist optimization.

According to an embodiment of the present invention, the goal of netlist optimization is to optimize timing of the system. In this embodiment, T(S) represent an estimate of the critical path delay if all logic elements in E are mapped to ($s_x(e)$, $s_y(e)$). The estimate may ignore the legality of locations and may be computed assuming a best case route is possible for each connection. In this example, P→M is minimally disruptive if incremental placement minimizes {T(M)-T(P)}. Any logic element can be moved from its preferred location as long as it does not degrade the critical path. According to one embodiment, routing area is also tracked to control excessive routing congestion. In this embodiment, A(S) represents the routing area consumed if the logic elements are mapped to ($s_x(e)$, $s_y(e)$). Minimal disruptiveness is satisfied by minimizing the relationships shown below.

$$\{T(M)-T(P)\}+\{A(M)-A(P)\} \tag{8}$$

Figure 16:
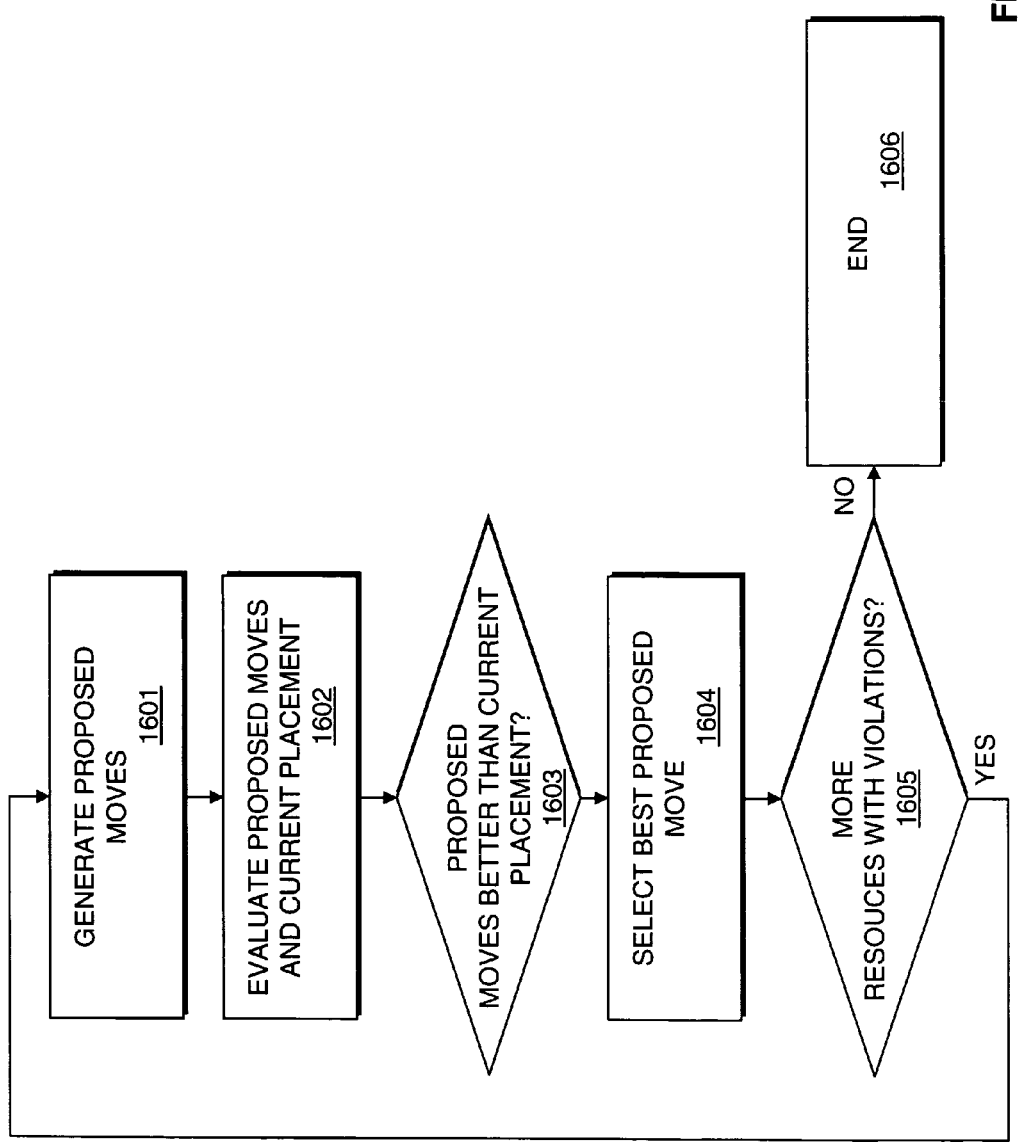
FIG. 16 is a flow chart illustrating a method for performing incremental placement according to an embodiment of the present invention.

FIG. 16 is a flow chart illustrating a method for performing incremental placement according to an embodiment of the present invention. The method described in FIG. 16 may be used to perform incremental placement as shown at 105 in FIG. 1. At 1601 proposed moves for all LEs in a LAB having architectural violations are generated. According to an embodiment of the present invention, proposed moves may include a move-to-fanin, move-to-fanout, move-to-sibling, move-to-neighbor, move-to-space, a move towards a critical vector, and other moves. A move-to-fanin involves moving an LE to a LAB that is a fanin of the LE. A move-to-fanout involves moving an LE to a LAB that is a fanout of the LE. A move-to-sibling involves moving an LE to a LAB that is fanout of a LAB that fans in to the LAB of the LE.

Figure 17:
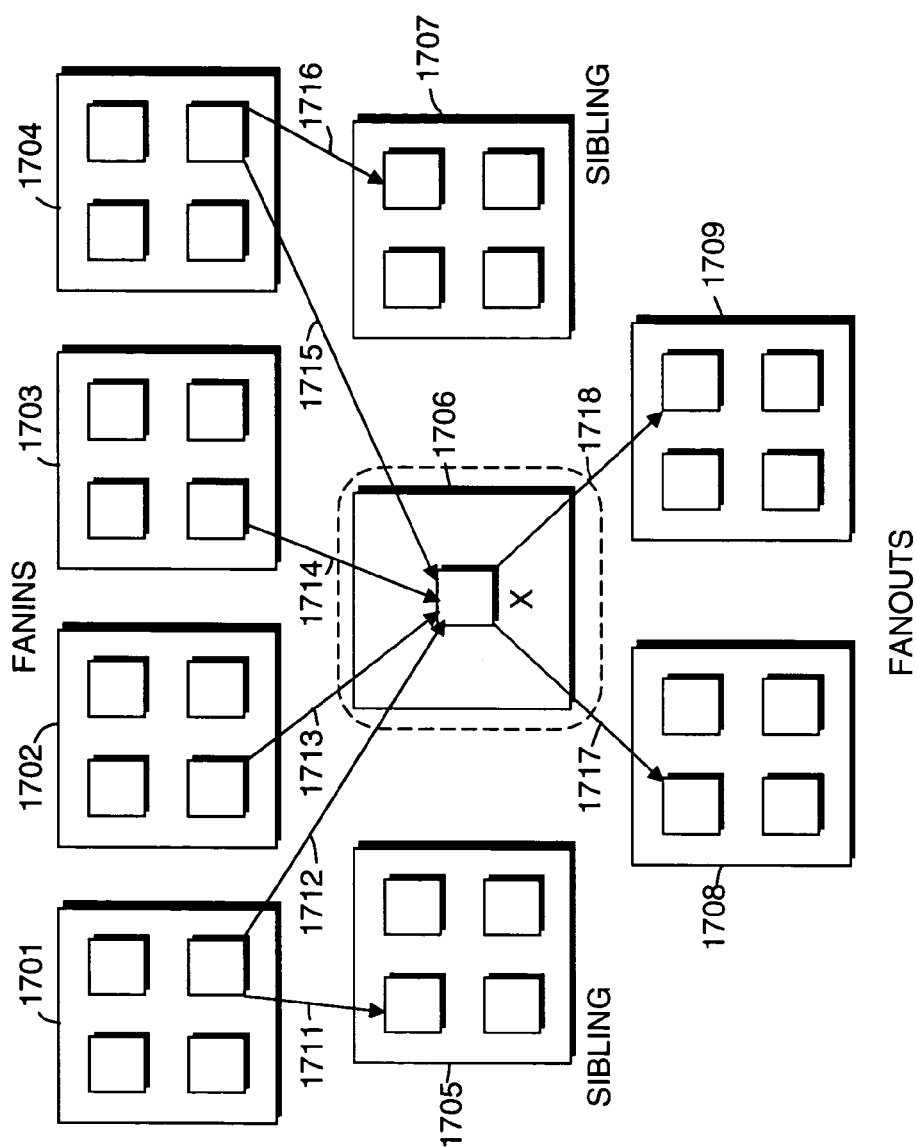
FIG. 17 illustrates fanin, fanout, and sibling relationship move proposals according to an embodiment of the present invention.

FIG. 17 illustrates examples of a move-to-fanin, move-to-fanout, and move-to-sibling. When a first LE in a first LAB transmits a signal to a second LE in a second LAB, the first LAB is said to be a fanin of the second LE. When a first LE in a first LAB receives a signal from a second LE in a second LAB, the first LAB is said to be a fanout of the second LE. When a first LE from a first LAB receives a signal from a second LE from a second LAB that also transmits to a third LE in a third LAB, the first LAB and the third LABs are said to be siblings. Blocks 1601-1609 illustrates a plurality of LABs. Each of the LABs 1601-1609 has a number of shown LEs. A plurality of arrows 1611-1618 are shown to illustrate the direction of a signal transmitted between LEs. Relative to LAB 1606, LABs 1601-1604 are considered fanins, LABs 1605 and 1607 are considered siblings, and LABs 1608 and 1609 are considered fanouts.

Figure 18:
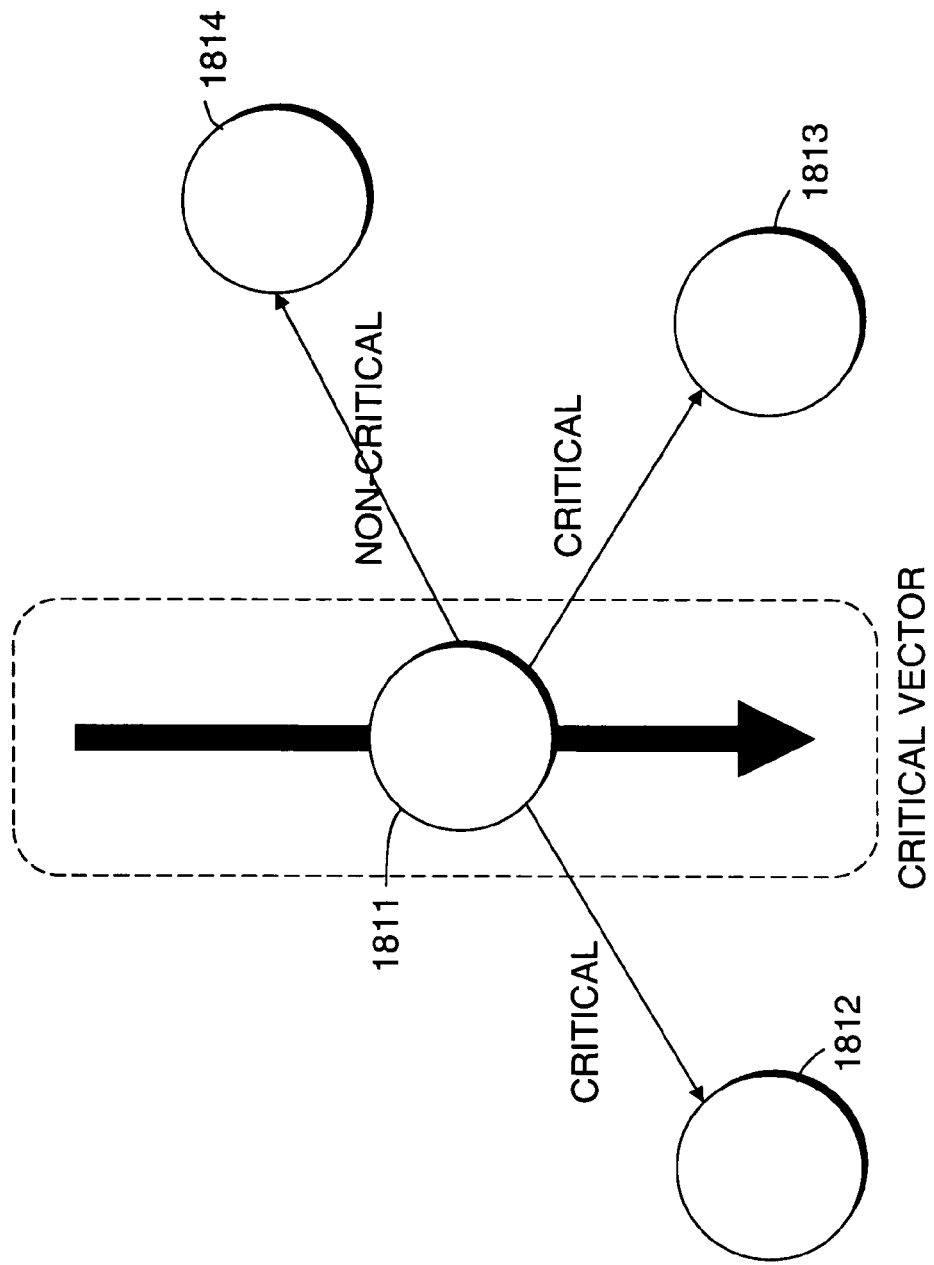
FIG. 18 illustrates an exemplary critical vector move proposal according to an embodiment of the present invention.

Proposed moves may also include move-to-neighbor, move-to-space, and move towards critical vector. A move-to-neighbor involves moving an LE to an adjacent LAB. A move-to-space involves a move to any random free LE location in a target device. A move towards critical vector involves moving an LE towards a vector that is computed by summing the directions of all critical connections associated with the moving LE. FIG. 18 illustrates an exemplary critical vector 1801. Vector 1801 is the critical vector of LE 1811 which has critical connections to LEs 1812 and 1813, and a non-critical connection with LE 1814.

Referring back to FIG. 16, at 1602, a current placement of LEs in a LAB with architectural violations and proposed moves of the LEs in the LAB are evaluated by a cost function. The cost function may include parameters which measure the legality of a LAB (cluster legality cost), timing (timing cost), and an amount of routing resources that is required for a placement (wirelength cost). According to an embodiment of the present invention, the cost function guides the reduction of architectural violations while ensuring minimal disruption. This cost function, C, is illustrated with the relationship shown below.

$$C = K_L * \text{ClusterCost} + K_T * \text{TimingCost} * K_W * \text{WirelengthCost} \tag{9}$$

$K_L$, $K_T$, and $K_W$ represent weighting coefficients that normalize the contributions of each parameter. It should be appreciated that other parameters may be used in addition to or in place of the parameters described.

The cluster legality cost is a cost associated with each LAB $CL_i$. This cost may be represented as shown below.

$$\begin{aligned} \text{ClusterCost}(CL_i) = &\; kE_i * \text{legality}(CL_i, n_E) + \\ &\; KI_i * \text{legality}(CL_i, n_I) + \\ &\; kR_i * \text{legality}(CL_i, n_R) + \\ &\; kO_i * \text{legality}(CL_i, n_O) + \\ &\; kC_i * \text{legality}(CL_i, n_C) + \end{aligned} \tag{10}$$

The legality ($CL_i$, . . . ) function returns a measure of legality for a particular constraint. A value of 0 indicates legality, while any positive value is proportional to the amount to which the constraint has been violated. Functions legality ($CL_i$, $n_E$), legality ($CL_i$, $n_I$), legality ($CL_i$, $n_O$), legality ($CL_i$, $n_R$), and legality ($CL_i$, $n_C$) evaluate if LAB $CL_i$ has a feasible number of logic elements, inputs, outputs, reset lines and clock lines, respectively. According to an embodiment of the present invention, the weighting coefficients $kE_i$, $KI_i$, $kO_i$, $kR_i$, and $kC_I$ are all initially set to 1 for every LAB $CL_i$ in the target device.

The timing cost associated with a placement may be represented as shown below.

$$\text{TimingCost} = TC_{VPR} + k_{DAMP} * TC_{DAMP} \tag{11}$$

The first parameter, $TC_{VPR}$, is based upon the cost used by a versatile placement and routing (VPR) placer. This cost may be represented with the following relationship.

$$TC_{VPR} = \Sigma_C \text{crit}(c) * \text{delay}(c) \tag{12}$$

This function encourages critical connections to reduce delay while allowing non-critical connections to optimize wirelength and other optimization criteria.

The second parameter, $TC_{DAMP}$, operates as a damping component of the timing cost function and can be represented with the following relationships.

$$TC_{DAMP} = \Sigma_C \max(\text{delay}(c) - \text{maxdelay}(c), 0.0) \tag{13}$$

$$\text{maxdelay}(c) = \text{delay}(c) + \alpha * \text{slack}(c) \tag{14}$$

The damping component penalizes any connection c whose delay(c) exceeds a maximum value maxdelay(c). This allows arbitrary moves to be made along a plateau defined by the maximum delays. The maxdelay values may be updated every time a timing analysis of the system is executed. The maxdelay values are controlled by the slack on the connection considered. The parameter α determines how much of a connection's slack will be allocated to the delay growth of the connection. Thus, the plateau is defined by the connection slack so that connection with large amounts of slack are free to move large distances in order to resolve architectural violations, while small slack values are relatively confined.

Figure 19:
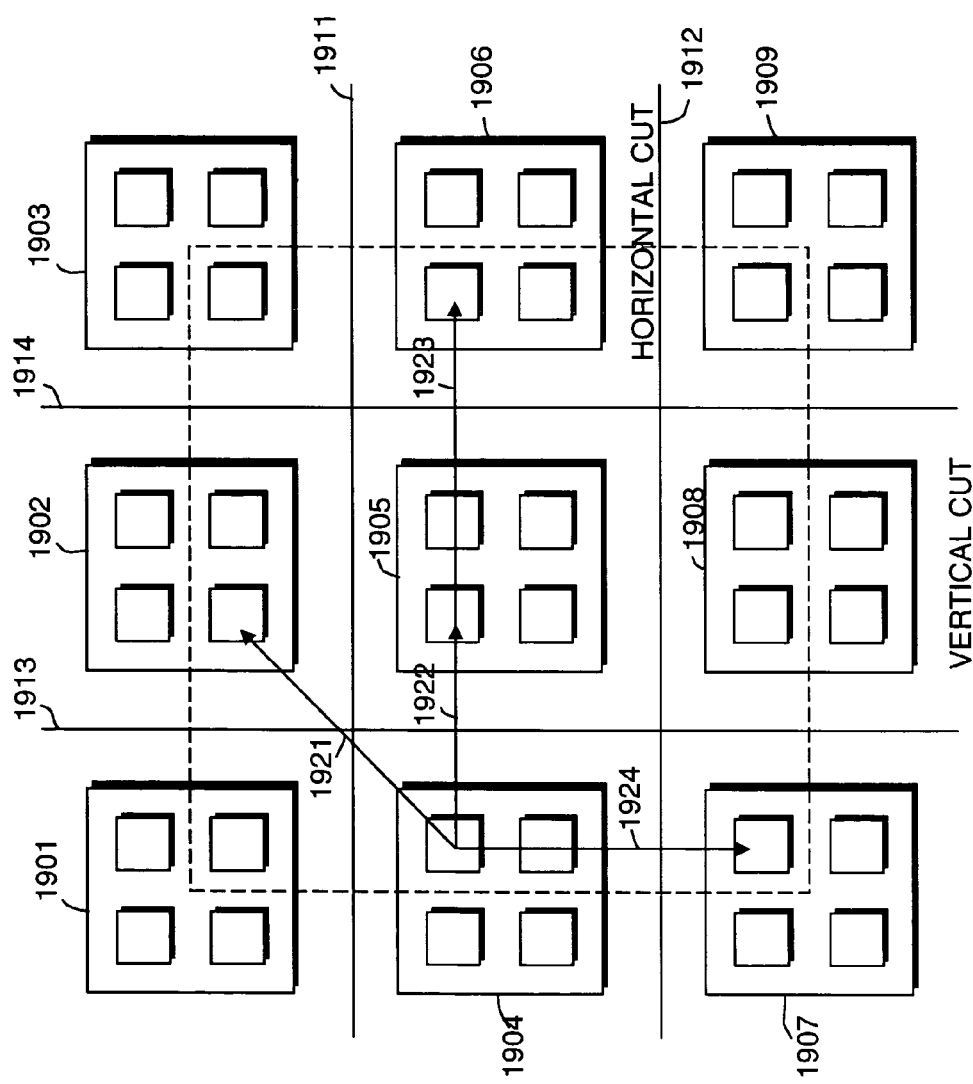
FIG. 19 illustrates horizontal and vertical cut-lines used for local congestion estimation according to an embodiment of the present invention.

Wirelength cost of a placement may be measured by determining a number of routing wires that cross cut-lines that outline a LAB. FIG. 19 illustrates the utilization of cut-lines according to an embodiment of the present invention. Blocks 1901-1909 represent LABs having a plurality of shown LEs. Horizontal cut-lines 1911 and 1912 and vertical cut-lines 1913 and 1914 are placed in each horizontal channel of a target device. Cut-lines provide a method to measure congestion by finding the regions that have the largest number of routing wires 1921-1924. This measurement may be used to prevent the formation of localized congested areas that can cause circuitous routes. The total number of routing wires that intersect a particular cut may be calculated by finding all the signals that intersect a particular cut-line and summing the average crossing-count for each of these signal wires. The average crossing count for a signal may be computed using the following relationship.

$$\text{CrossingCount(net)}=q(\text{NumCLBlockPins(net)}) \quad (15)$$

The function q is given as a number of discrete crossing counts as a function of signal pin count. The argument to the function q is the number of clustered logic block pins used to wire the signal. With respect to the functions shown in (10)-(15), it should be appreciated that other types of functions may be used in addition or in place of the functions represented.

Referring back to FIG. 16, at 1603, it is determined whether the cost associated with any of the proposed moves is better than the cost associated with the current placement. The costs associated with the proposed moves and current placement may be obtained by using cost function values generated from using the cost function described with respect to 1602. If it is determined that the cost associated with any of the proposed moves is better than the cost associated with the current placement, control proceeds to 1604. If it is determined that the cost associated with any of the proposed moves is not better than the cost associated with the current placement, control proceeds to 1605.

At 1604, the proposed move associated with the best cost is selected as the current placement.

At 1605, it is determined whether any additional LABs in the system have architectural violations. If additional LABs in the system have architectural violations, control will move to one of these LABs and proceeds to 1601. If no additional LABs in the system have architectural violations, control proceeds to 1606 and terminates the procedure. According to an embodiment of the present invention, a counter may be used to track the number of proposed moves that have been generated, or the number of LEs or LABs that have had proposed moves generated. In this embodiment, when this number exceeds a threshold value, instead of proceeding to 1601, control terminates the procedure and returns an indication that a fit was not found.

Figure 20:
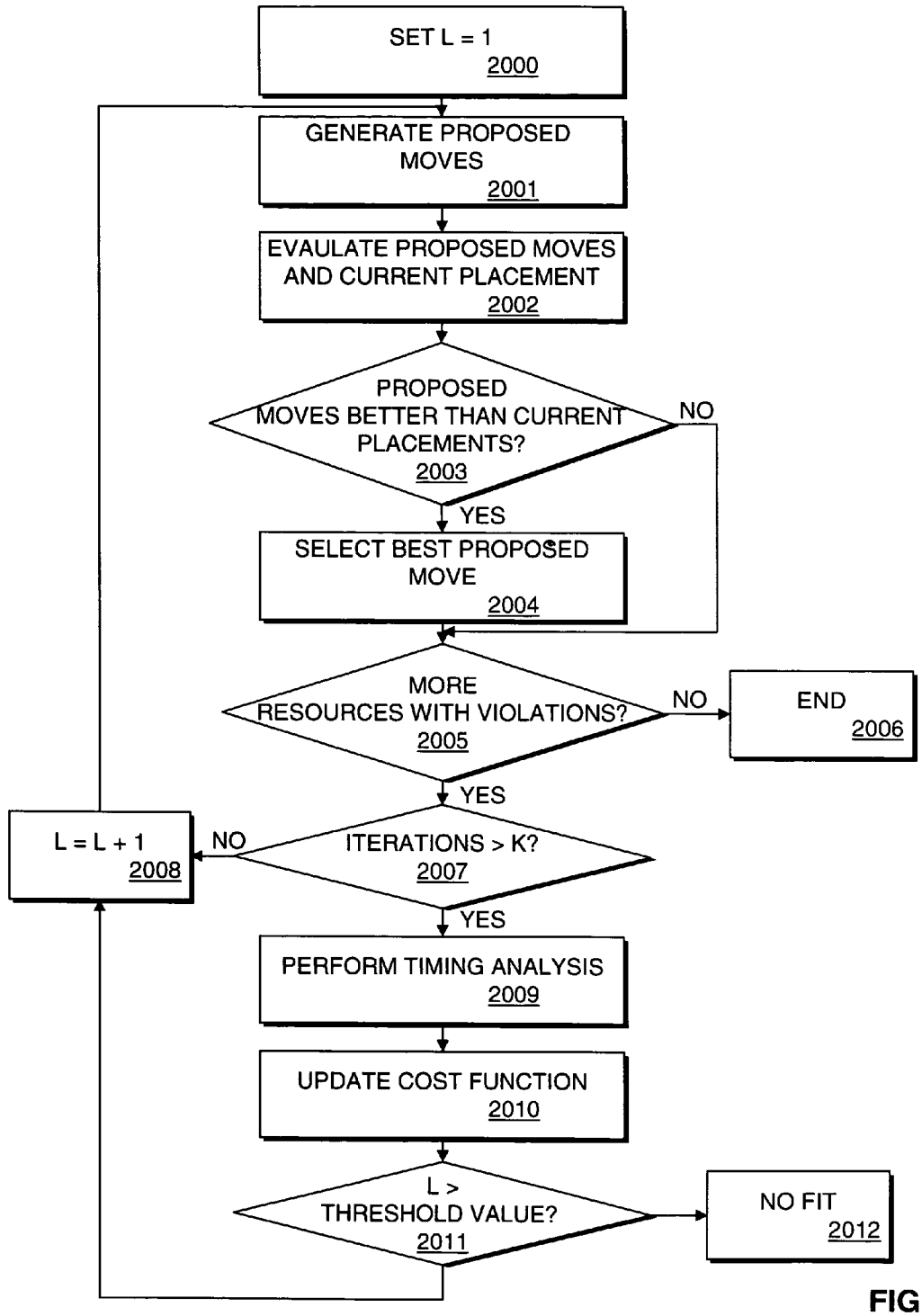
FIG. 20 is a flow chart illustrating a method for performing incremental placement utilizing directed hill-climbing according to an embodiment of the present invention.

FIG. 20 is a flow chart illustrating a method for performing incremental placement utilizing directed hill-climbing according to an embodiment of the present invention. The method described in FIG. 20 may be used to perform incremental placement as shown as 105 in FIG. 1. At 2000, a loop iteration index, L, is set to 1.

At 2001 proposed moves for all LEs in a LAB having architectural violations are generated. According to an embodiment of the present invention, the proposed moves may be generated similarly as described in 1601 shown in FIG. 16. The number of LEs having proposed moves generated is recorded.

At 2002, a current placement of LEs in a LAB with architectural violations and proposed moves of the LEs in the LAB are evaluated by a cost function. According to an embodiment of the present invention, the evaluation performed may be similarly conducted as described in 1602 of FIG. 16.

At 2003, it is determined whether the cost associated with any of the proposed moves is better than the cost associated with the current placement. The costs associated with the proposed moves and current placement may be obtained by using values generated from using the cost function described with respect to 1602. If the cost associated with any of the proposed moves is better than the cost associated with the current placement, control proceeds to 2004. If the cost associated with any of the proposed moves is not better than the cost associated with the current placement, control proceeds to 2005.

At 2004, the proposed move associated with the best cost is selected as the current placement.

At 2005, it is determined whether any additional LABs in the system have architectural violations. If additional LABs in the system have architectural violations, control will move to one of these LABs and proceeds to 2007. If no additional LABs in the system have architectural violations, control proceeds to 2006 and terminates the procedure.

At 2007, it is determined whether the number of LEs that have proposed moves generated exceeds the value K where K is a predefined value. If the number of LEs that have proposed moves generated exceeds the value K, control proceeds to 2009. If the number of LEs that have proposed moves generated does not exceed the value K, control proceeds to 2008.

At 2008, the loop iteration index, L, is incremented. Control returns to 2001.

At 2009, timing analysis is performed. According to an embodiment of the present invention, the values for maxdelay and crit(c), used for evaluating timing cost, are updated to reflect the current configuration of the system.

At 2010, the cost function is updated. According to an embodiment of the present invention, weighting coefficients in the ClusterCost parameter are incremented in proportion to an amount of violation. Updating the cost function allows directed hill-climbing to be performed. Directed hill-climbing is a technique that is used for generating proposed moves when moves cannot be found to decreases the current cost of a placement.

Figure 21:
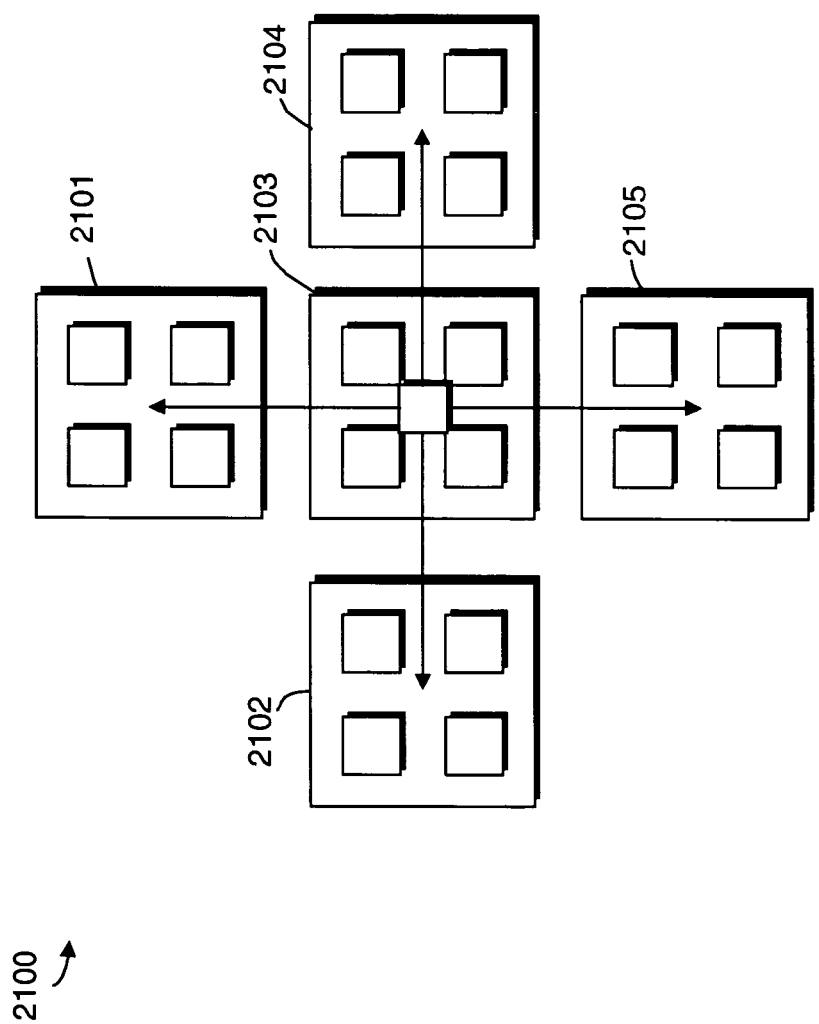
FIG. 21 illustrates a component trapped in a local minima according to an embodiment of the present invention.

FIG. 21 illustrates an example where directed hill-climbing may be applied. The target device 2100 includes a plurality of LABs 2101-2105 each having a plurality of shown LEs. In this example, LAB 2103 has one LE more than is allowed by its architectural specification. Every possible move attempt to resolve the architectural constraints of the center LAB 2103 results in another architectural violation. If all architectural violations are costed in the same manner, then the method described in FIG. 16 may have difficulties resolving the constraint violation.

Figure 22:
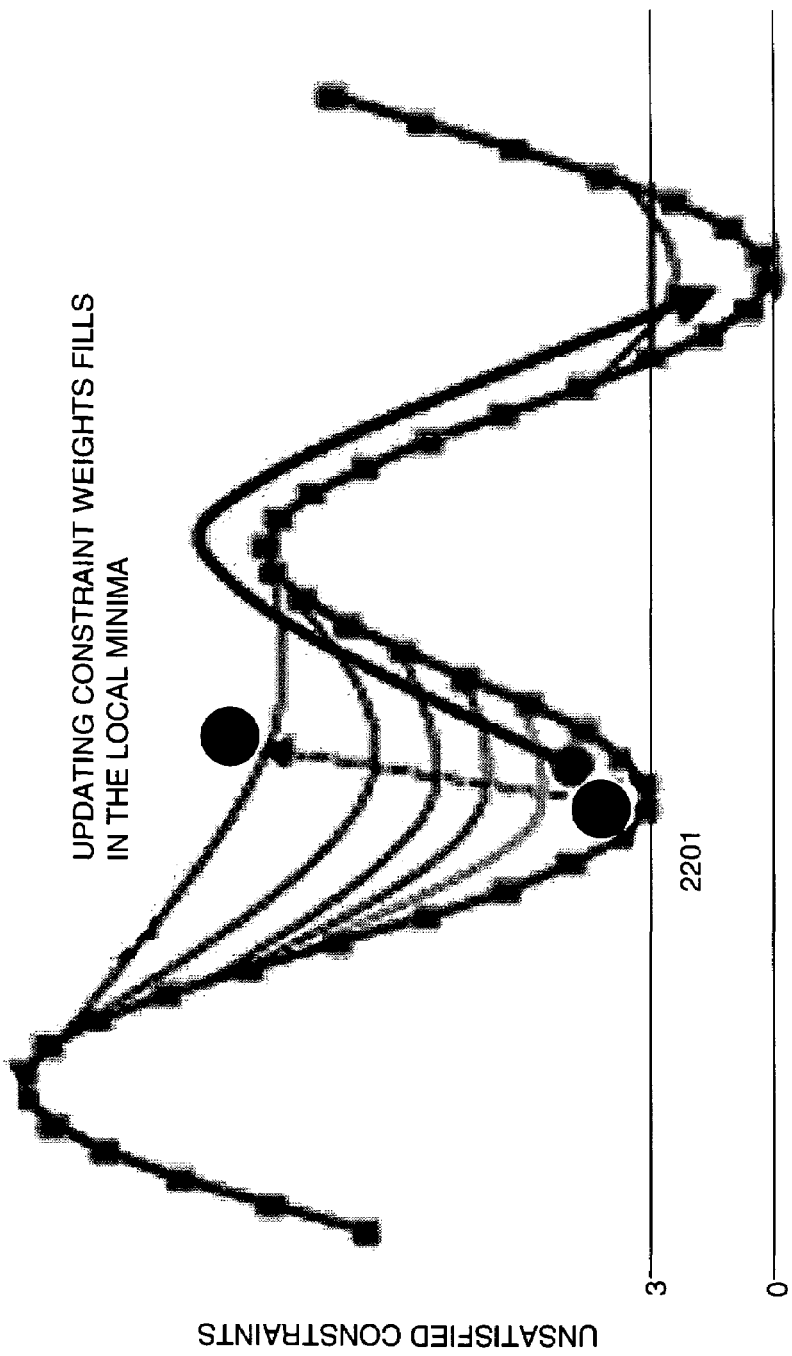
FIG. 22 illustrates basin-filling according to an embodiment of the present invention.

FIG. 22 illustrates a two dimensional slice of the multi-dimensional cost function described. The current state 2201 represents the situation shown in FIG. 21. No single move in the neighborhood of the current state finds a solution with a lower cost. However, the cost function itself could be modified to allow for the current state 2201 to climb the hill. The weighting coefficients of the cost function may be gradually increased for LABs that have unsatisfied constraints. A higher weight may be assigned to unsatisfied constraints that have been violated over a long period of time or over many iterations. This results in the cost function being reshaped to allow for hill climbing. The reshaping of the cost function has the effect of filling a basin where the local minima is trapped. Referring back to FIG. 22, once the weighting coefficients have been increased for LAB 2103, a proposed move to one of the adjacent cluster may be made to allow for shifting the violation "outwards" to a free space.

Updating a cost function also allows for a quick convergence by preventing a phenomenon known as thrashing. Thrashing occurs when incremental placement is trapped in an endless cycle where an LE is moved between two points in the configuration space which both result in architectural violations. By increasing the cost or penalty for moving to the two points, a move to a third point would eventually be more desirable and accepted.

Referring back to FIG. 20, at 2011, it is determined whether the loop index, L, is greater than a threshold value. If the loop index, L, is not greater than the threshold value, control proceeds to 2008. If the loop index, L, is greater than the threshold value, control proceeds to 2012.

At 2012, control terminates the procedure and returns an indication that a fit was not found.

Referring back to FIG. 1, at 106, it is determined whether additional restructuring needs to be performed. According to an embodiment of the present invention, it is determined whether additional critical signals exist that have not been processed. If additional critical signals exist, control returns to 104 to expand components of the system used for processing the next most critical signal among the remaining critical signals. If no additional critical signals exist, control proceeds to 107.

It should be appreciated that the procedure in 106 may not need to be performed if functional decomposition was performed in 105. In this embodiment, a timing analysis is performed on the modified system design after incremental placement. If the timing of the system with the modified system design after incremental placement is better than the timing of the system with the original system design as determined in 1001, control proceeds directly to 107. If the timing of the system with the modified system after incremental placement is worse than the timing of the system with the original system design as determined in 1001, control reverts to the original system design before proceeding to 107.

At 107, routing of the system is performed. During routing, routing resources on the target device are allocated to provide interconnections between logic gates, logic elements, and other components on the target device. The routing procedure may be performed by a router in an EDA tool that utilizes routing algorithms.

The incremental placement techniques disclosed allow logic changes to be incorporated into an existing system design without reworking placement of the entire system. The incremental placement techniques attempt to minimize disruption to the original placement and maintain the original timing characteristics. According to an embodiment of the present invention, a method for designing a system on a target device utilizing FPGAs is disclosed. The method includes placing new LEs at preferred locations on a layout of an existing system. Illegalities in placement of the components are resolved. According to one embodiment, resolving the illegalities in placement may be achieved by generating proposed moves for an LE, generating cost function values for a current placement of the LE and for placements associated with the proposed moves, and accepting a proposed move if its associated cost function value is better than the cost function value for the current placement.

FIGS. 1, 4, 10, 12, 16, and 20 are flow charts illustrating embodiments of the present invention. Some of the techniques illustrated in these figures may be performed sequentially, in parallel or in an order other than that which is described. It should be appreciated that not all of the techniques described are required to be performed, that additional techniques may be added, and that some of the illustrated techniques may be substituted with other techniques.

Embodiments of the present invention (e.g. exemplary process described with respect to FIGS. 1, 4, 10, 12, 16, and 20) may be provided as a computer program product, or software, that may include a machine-readable medium having stored thereon instructions. The machine-readable medium may be used to program a computer system or other electronic device. The machine-readable medium may include, but is not limited to, floppy diskettes, optical disks, CD-ROMs, and magneto-optical disks, ROMs, RAMs, EPROMs, EEPROMs, magnetic or optical cards, flash memory, or other type of media/machine-readable medium suitable for storing electronic instructions.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for designing a system on a target device utilizing field programmable gate arrays (FPGAs), comprising:
   synthesizing a design for the system;
   mapping components in the design onto resources on the target device;
   determining placement locations for the components on the target device; and
   restructuring the design for the system after placement locations for the components are determined and prior to routing the system to improve timing for the system by identifying critical sinks in the system, for each critical sink in the system identifying whether the critical sink has a corresponding first logic element (LE) that drives the critical sink and a second LE that is driven by the critical sink, and determining a best decomposition for each of the first and second LEs based on one of 1) swapping inputs to the first and second LEs on paths having a criticality beyond a threshold level and 2) swapping all inputs to the first and second LEs.

2. The method of claim 1, wherein restructuring the design for the system comprises performing decomposition on one or more critical sections of the system.

3. The method of claim 1, further comprising:
   performing incremental placement on restructuring in the design;
   performing a timing analysis on a placed modified design for the system; and
   reverting to the design for the system if the timing analysis indicates no improvement in the timing for the system.

4. The method of claim 1, wherein determining the best decomposition for each of the first and second LEs is based on swapping inputs to the first and second LEs on paths having a criticality beyond a threshold level when a number of inputs to an LE on the target device exceeds a threshold number.

5. A method for designing a system on a target device utilizing field programmable gate arrays (FPGAs), comprising:

synthesizing a design for the system;
mapping components in the design onto resources on the target device;
determining placement locations for the components on the target device; and
restructuring the design for the system after placement locations for the components are determined to improve timing for the system by identifying critical sinks in the system, for each critical sink in the system identifying whether the critical sink has a corresponding first logic element (LE) that drives the critical sink and a second LE that is driven by the critical sink, and determining a best decomposition for each of the first and second LEs based on swapping inputs on paths having a criticality beyond a threshold level.

6. The method of claim 5, wherein determining the best decomposition comprises:
determining one or more decompositions of the first and second LEs based on swapping the inputs on paths having the criticality beyond the threshold level; and
performing a timing analysis on the one or more decompositions to identify a decomposition with a shortest timing.

7. The method of claim 5, further comprising:
sorting the best decompositions; and
implementing the best decompositions in the design for the system in an order of the sort as physically allowed.

8. The method of claim 7, wherein sorting the best decompositions comprises ordering the best decompositions using a cost function based upon criticality.

9. The method of claim 7, wherein sorting the best decompositions comprises ordering the best decomposition using a cost function based upon criticality and improvement in timing.

10. The method of claim 7, further comprising:
performing a timing analysis on a modified design for the system; and
reverting to the design for the system if the timing analysis indicates no improvement in the timing for the system.

11. A machine-readable medium having stored thereon sequences of instructions, the sequences of instructions including instructions which, when executed by a processor, causes the processor to perform:
synthesizing a design for a system on a target device utilizing field programmable gate arrays (FPGA);
mapping components in the design onto resources on the target device;
determining placement locations for the components on the target device; and
restructuring the design for the system after placement locations for the components are determined to improve timing for the system by identifying critical sinks in the system, for each critical sink in tile system identifying whether the critical sink has a corresponding first logic element (LE) that drives the critical sink and a second THE that is driven by the critical sink, and determining a best decomposition for each of tile first and second LEs based on swapping inputs having a criticality beyond a threshold level.

12. The machine-readable medium of claim 11, wherein determining the best decomposition comprises:
determining one or more decompositions of the first and second LEs based oil swapping the inputs having the criticality beyond the threshold level; and
performing a timing analysis on the one or more decompositions to identify a decomposition with a shortest timing.

13. The machine-readable medium of claim 11, comprising further instructions which when executed by the processor, causes the processor to perform:
sorting the best decompositions; and
implementing the best decompositions in the design for the system in an order of tile sort as physically allowed.

14. The machine-readable medium of claim 13, comprising further instructions which when executed by tile processor, causes the processor to perform:
performing a timing analysis on a modified design for the system; and
reverting to the design for the system if the timing analysis indicates no improvement in the timing for the system.

* * * * *